US012755764B2

(12) United States Patent
Jeong et al.

(10) Patent No.: US 12,755,764 B2
(45) Date of Patent: Oct. 6, 2026

(54) SENSE AMPLIFIERS AND OPERATION METHODS THEREOF, AND MEMORY DEVICES INCLUDING THE SAME

(71) Applicant: Samsung Electronics Co., Ltd., Suwon-si (KR)

(72) Inventors: Haewook Jeong, Suwon-si (KR); Changyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 18/633,650

(22) Filed: Apr. 12, 2024

(65) Prior Publication Data

US 2025/0118342 A1 Apr. 10, 2025

(30) Foreign Application Priority Data

Oct. 4, 2023 (KR) ........................ 10-2023-0131992

(51) Int. Cl.

*G11C 7/06* (2006.01)
*G11C 7/08* (2006.01)
(Continued)

(52) U.S. Cl.

CPC .............. *G11C 7/062* (2013.01); *G11C 7/065* (2013.01); *G11C 7/08* (2013.01); *G11C 7/12* (2013.01); *G11C 11/4091* (2013.01)

(58) Field of Classification Search

CPC ........... G11C 7/062; G11C 7/065; G11C 7/08; G11C 7/12; G11C 11/4091; G11C 11/4094

See application file for complete search history.

(56) References Cited

U.S. PATENT DOCUMENTS

| | | | |
|---|---|---|---|
| 8,125,840 | B2 | 2/2012 | Barth et al. |
| 9,324,430 | B2 | 4/2016 | Chishti et al. |

(Continued)

FOREIGN PATENT DOCUMENTS

| | | | |
|---|---|---|---|
| JP | 2005285291 | A | 10/2005 |
| JP | 4120013 | B2 | 5/2008 |
| WO | 2021202575 | A1 | 10/2021 |

OTHER PUBLICATIONS

"B. Jayaraman et al., "80-kb Logic Embedded High-K Charge Trap Transistor-Based Multi-Time-Programmable Memory With No Added Process Complexity," in IEEE Journal of Solid-State Circuits, vol. 53, No. 3, pp. 949-960, Mar. 2018, doi: 10.1109/JSSC.2017. 278476".

*Primary Examiner* — Amir Zarabian
*Assistant Examiner* — Justin Bryce Heisterkamp
(74) *Attorney, Agent, or Firm* — Wolf, Greenfield & Sacks, P.C.

(57) ABSTRACT

A sense amplifier connected to a bit line and a complementary bit line, the sense amplifier including a first transistor connected between the bit line and a first node and including a first gate terminal connected to a third node, a second transistor connected between the first node and the complementary bit line and including a second gate terminal connected to a fourth node, third transistor connected between the bit line and a second node and including a third gate terminal connected to the third node, and a fourth transistor connected between the complementary bit line and the second node and including a fourth gate terminal connected to the fourth node, wherein first and second RC values viewed from the sense amplifier toward the bit line and the complementary bit line differ, and wherein the second transistor is configured to receive a program voltage during a first time period.

16 Claims, 25 Drawing Sheets

(51) Int. Cl.
*G11C 7/12* (2006.01)
*G11C 11/4091* (2006.01)

(56) References Cited

U.S. PATENT DOCUMENTS

| | | | | |
|---|---|---|---|---|
| 9,443,592 | B2 | 9/2016 | Kato et al. | |
| 9,443,990 | B2 | 9/2016 | Kato et al. | |
| 9,847,109 | B2 | 12/2017 | Van Houdt | |
| 10,468,104 | B1 * | 11/2019 | Anand | G11C 16/26 |
| 11,417,407 | B1 * | 8/2022 | Jayaraman | G11C 29/50004 |
| 2011/0051532 | A1 | 3/2011 | Barth et al. | |
| 2013/0028002 | A1 * | 1/2013 | Liu | G11C 7/065 365/104 |
| 2015/0024577 | A1 | 1/2015 | Kato et al. | |
| 2015/0054548 | A1 | 2/2015 | Kato et al. | |
| 2015/0318043 | A1 | 11/2015 | Chishti et al. | |
| 2017/0178698 | A1 | 6/2017 | Van Houdt | |
| 2022/0180923 | A1 * | 6/2022 | Jaiswal | G11C 11/419 |
| 2023/0064611 | A1 * | 3/2023 | Lee | G11C 7/08 |
| 2023/0178146 | A1 * | 6/2023 | Nouri | G11C 11/419 365/154 |
| 2024/0135977 | A1 * | 4/2024 | Shin | G11C 7/1006 |
| 2024/0177765 | A1 * | 5/2024 | Jang | G11C 11/4091 |
| 2025/0056784 | A1 * | 2/2025 | Liaw | G11C 11/412 |
| 2025/0085858 | A1 * | 3/2025 | Kim | G06F 3/0679 |

* cited by examiner

SENSE AMPLIFIERS AND OPERATION METHODS THEREOF, AND MEMORY DEVICES INCLUDING THE SAME

CROSS-REFERENCE TO RELATED APPLICATION

This application claims priority to and the benefit of Korean Patent Application No. 10-2023-0131992, filed in the Korean Intellectual Property Office on Oct. 4, 2023, the entire contents of which are incorporated by reference herein.

BACKGROUND

(a) Technical Field

The present disclosure relates to semiconductor memory devices. More specifically, the present disclosure relates to sense amplifiers included in semiconductor memory devices and operation methods thereof.

(b) Description of the Related Art

A sense amplifier may be connected to a memory cell array through a bit line and a complementary bit line. The sense amplifier may sense and amplify a voltage difference between the bit line and the complementary bit line, with the voltages of the bit line and the complementary bit line determined according to or based on data stored in the memory cell array.

However, the connection of the sense amplifier to the bit line and the complementary bit line may be unbalanced. For example, depending on the implementation method or processing dispersion of the memory device, the sense amplifier may be unbalancedly connected to the bit line and the complementary bit line. In this case, an error may occur in the operation of the sense amplifier.

SUMMARY

The present disclosure may provide one or more solutions to technical problems, including (but not limited to) the technical problem described above. More specifically, the present disclosure may provide sense amplifiers that compensate for imbalances in connections to a bit line and a complementary bit line, and operation methods thereof.

Some embodiments of the present disclosure provide a sense amplifier connected to a bit line and a complementary bit line, including: a first transistor connected between the bit line and a first node, the first transistor including a first gate terminal connected to a third node; a second transistor connected between the first node and the complementary bit line, the second transistor including a second gate terminal connected to a fourth node; a third transistor connected between the bit line and a second node, the third transistor including a third gate terminal connected to the third node; and a fourth transistor connected between the complementary bit line and the second node, the fourth transistor including a fourth gate terminal connected to the fourth node, wherein a first resistance-capacitance (RC) value as viewed from the sense amplifier toward the bit line is smaller than a second RC value as viewed from the sense amplifier toward the complementary bit line, and wherein the second transistor is configured to receive a program voltage that higher than a power supply voltage during a first time period.

Some embodiments of the present disclosure provide an operation method of a sense amplifier connected to a bit line and a complementary bit line, the operation method including: performing a first precharge operation for the bit line and the complementary bit line; performing a first sensing operation for the bit line and the complementary bit line precharged based on the first precharge operation; and in response to a voltage level of the bit line changing to a first voltage level based on the first sensing operation, performing a first program operation for a first transistor connected to one of the bit line and the complementary bit line.

Some embodiments of the present disclosure provide a memory device including: a memory cell array connected to a bit line and a complementary bit line; and a sense amplifier connected to the bit line through a first conductive line and connected to the complementary bit line through a second conductive line having a different length from the first conductive line. The sense amplifier may include first and second transistors connected in series between the first conductive line and the second conductive line and having a first channel type; and third and fourth transistors connected in series between the first conductive line and the second conductive line and having a second channel type, and wherein threshold voltages of the first and second transistors are different from each other.

DETAILED DESCRIPTION OF THE EMBODIMENTS

Hereinafter, some embodiments of the present disclosure will be described in detail and with sufficient clarity to permit one skilled in the art to carry out the present disclosure. Some details, such as various components and structures described in the specification, are merely provided to assist the overall understanding of the examples of embodiments presently provided herein. Therefore, it should be apparent to those skilled in the art that various changes and modifications of the embodiments described herein may be made without departing from the scope of the present disclosure. Moreover, descriptions of well-known functions and structures may be omitted for the sake of clarity and brevity. In the accompanying drawings or in the following detailed description, some components may be connected to any other components except for components that are illustrated in drawings or are described in the detailed description that are described as not connectable. The terms used herein may include terms defined in consideration of various functions and are not limited to a specific function. The definitions of the terms should be determined based on the contents throughout the specification.

Some components, such as those that are described in the detailed description with reference to the terms “driver”, “controller”, “block”, or the like, may be implemented with software, hardware, or a combination thereof. For example, software may be or may include a machine code, firmware, an embedded code, and application software. For example, hardware may be or may include an electrical circuit, an electronic circuit, a processor, a microprocessor, a computer, integrated circuit cores, a pressure sensor, an inertial sensor, a microelectromechanical system (MEMS), and/or a passive element, or a combination of two or more thereof.

Figure 1:
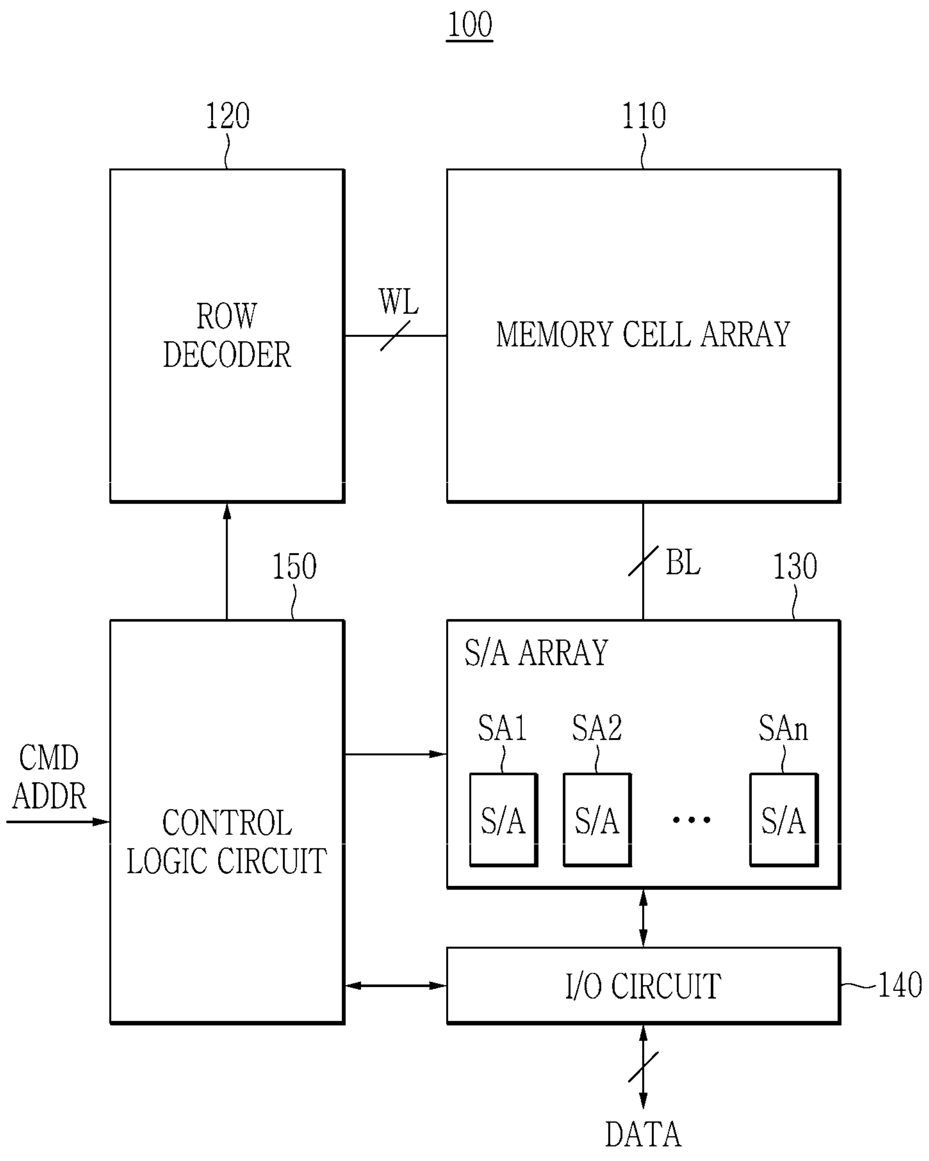
FIG. 1 illustrates a block diagram of a memory device according to some embodiments of the present disclosure.

FIG. 1 illustrates a block diagram of a memory device according to some embodiments of the present disclosure. Referring to FIG. 1, a memory device 100 may include a memory cell array 110, a row decoder 120, a sense amplifier array 130, and an input/output (I/O) circuit 140, and a control logic circuit 150.

The memory cell array 110 may include a plurality of memory cells arranged in a row direction and a column direction. The plurality of memory cells may be connected to a plurality of word lines WL that extend in the row direction and a plurality of bit lines BL that extend in the column direction.

Hereinafter, for a more concise description, an example of an embodiment in which each of the plurality of memory cells is a dynamic random access memory (DRAM) cell will be mainly described. However, the scope of the present disclosure is not limited thereto, and each of the plurality of memory cells may be any type of volatile memory cell, such as a static random access memory (SRAM) cell, or any type of non-volatile memory cell, such as a flash memory cell. That is, the scope of the present disclosure is not limited to the DRAM type of memory device 100 described herein.

The row decoder 120 may control the plurality of word lines WL. For example, the row decoder 120 may activate some of the plurality of word lines WL based on an address ADDR provided to the control logic circuit 150 from an external source or device (not shown in FIG. 1).

The sense amplifier array 130 may include a plurality of sense amplifiers SA. For example, the sense amplifier array 130 may include first to n-th sense amplifiers SA1 to SAn.

Each of the plurality of sense amplifiers SA may be connected to the plurality of bit lines BL. For example, each of the plurality of sense amplifiers SA may be connected to a bit line and a bit line complementary thereto (hereinafter, it will be referred to as a complementary bit line). Each of the plurality of sense amplifiers SA may sense and amplify a voltage level change of the bit line BL connected thereto based on a voltage level difference between the bit line and the complementary bit line connected thereto.

In some embodiments, the connections to the bit line and the connection to the complementary bit line of each of the plurality of sense amplifiers SA may be unbalanced. For example, due to the structure or process dispersion of the memory device 100, each of the plurality of sense amplifiers SA may be unbalancedly connected to the bit line and the complementary bit line. In this case, voltage levels of the bit line and the complementary bit line may be amplified unlike intended voltage levels e.g., in a manner different from intended or expected voltage levels present when the bit line and complementary bit line are connected to the sense amplifier SA in a balanced manner. That is, an error may occur in the operation of the sense amplifier due to an imbalance in the connections to the bit line and complementary bit line of each of the plurality of sense amplifiers SA.

In some embodiments, each of the plurality of sense amplifiers SA may include one or more charge trap transistors. In this case, depending on an amount of charge trapped in the charge trap transistor, the imbalance in the connections to the bit line and the complementary bit line of each of the plurality of sense amplifiers SA may be compensated for or mitigated. A more detailed configuration and operation of the sense amplifier SA will be provided herein.

The input/output circuit 140 may output data corresponding to a change in the voltage level of the bit line BL amplified by the sense amplifier array 130 to the outside (e.g., to the external device), and/or may receive data from the outside (e.g., from the external device or external source).

The control logic circuit 150 may receive a command CMD and an address ADDR, e.g., from the external source or external device. The control logic circuit 150 may control an overall operation of the memory device 100 based on the command CMD and the address ADDR.

In some embodiments, the control logic circuit 150 may provide a plurality of control signals to the sense amplifier array 130. For example, the control logic circuit 150 may provide the plurality of control signals to the sense amplifier array 130 to control the operation of each of the plurality of sense amplifiers SA. However, the present disclosure is not limited thereto.

Figure 2:
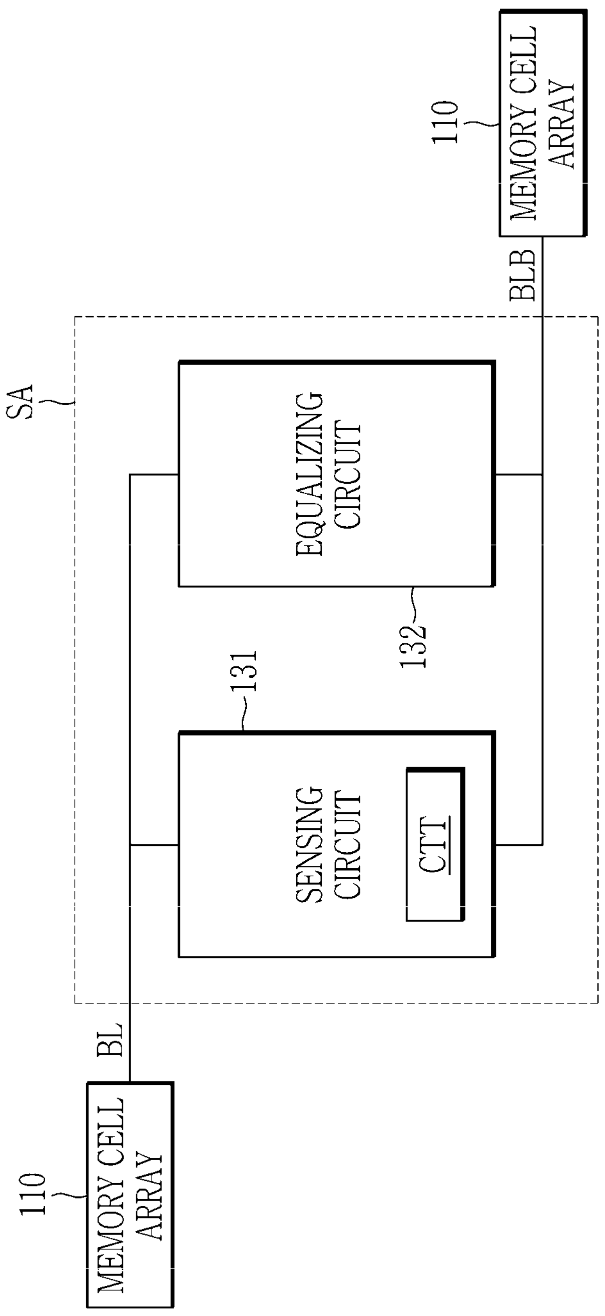
FIG. 2 illustrates a detailed block diagram of a sense amplifier of FIG. 1.

FIG. 2 illustrates a detailed block diagram of a sense amplifier of FIG. 1, i.e., one sense amplifier SA of the plurality of sense amplifiers of the sense amplifier array 130. Hereinafter, the configuration of one of the plurality of sense amplifiers SA shown in FIG. 1 will be representatively described with reference to FIG. 1 and FIG. 2.

The sense amplifier SA may be connected a bit line BL and a complementary bit line BLB. That is, the sense amplifier SA may be connected to the memory cell array 110 through both the bit line BL and the complementary bit line BLB.

The sense amplifier SA may include a sensing circuit 131 and an equalizing circuit 132. Each of the sensing circuit 131 and the equalizing circuit 132 may be connected between the bit line BL and the complementary bit line BLB.

The equalizing circuit 132 may perform a precharge operation for the bit line BL and the complementary bit line BLB. For example, the equalizing circuit 132 may provide a precharge voltage to the bit line BL and the complementary bit line BLB. That is, the equalizing circuit 132 may precharge the bit line BL and the complementary bit line BLB based on a single precharge voltage.

After the precharge operation is performed, the memory device 100 may perform a memory cell activating operation. For example, the memory device 100 may activate one of the memory cells included in the memory cell array 110 by activating an arbitrary word line WL. In this case, the voltage level of the bit line BL may change based on the amount of charge stored in the activated memory cell. That is, as the memory cell activating operation is performed, charge sharing may occur between the memory cell and the bit line BL.

After the charge sharing is completed, the sensing circuit 131 may perform a sensing operation. For example, the sensing circuit 131 may sense and amplify a change in the voltage level of the bit line BL, which may be increased or decreased by charge sharing, based on the voltage levels of the bit line BL and the complementary bit line BLB.

For a more detailed example, when a sensing operation is performed, the sensing circuit 131 may increase the voltage level of a first line (one of the bit line BL and the complementary bit line BLB) having a relatively high voltage level to a power supply voltage, and may decrease the voltage level of a second line (the other of the bit line BL and the complementary bit line BLB) having a relatively low voltage level to a ground voltage. In this case, the input/output circuit 140 may output data corresponding to the voltage level of the bit line BL changed to the power supply voltage or the ground voltage (that is, the voltage level of the amplified bit line BL) to an external destination.

In some embodiments, the sensing operation may also be referred to as a sense amplifying operation. However, the present disclosure is not limited thereto.

Hereinafter, for a more concise description, the voltage levels of the bit line BL and the complementary bit line BLB that are increased or decreased as the sensing operation is performed may be referred to as voltage levels of the amplified bit line BL and complementary bit line BLB. In this case, the voltage levels of the amplified bit line BL and complementary bit line BLB may be the power source voltage or ground voltage. However, the present disclosure is not limited to these terms.

Meanwhile, the sense amplifier SA may be unbalancedly connected to the bit line BL and the complementary bit line BLB. For example, a product of a resistance value of the memory cell array 110 viewed through the bit line BL in the sense amplifier SA and a capacitance value of the memory cell array 110 viewed through the bit line BL in the sense amplifier may be referred to as a first resistance-capacitance (RC) value; and a product of a resistance value of the memory cell array 110 viewed through the complementary bit line BLB in the sense amplifier SA and a capacitance value of the memory cell array 110 viewed through the complementary bit line BLB in the sense amplifier may be referred to as a second RC value. In this case, the first RC value and the second RC value may be different.

In some embodiments, the imbalance in the connection to the bit line BL and the complementary bit line BLB of the sense amplifier SA may be caused by the physical structure of the memory device 100 or the process dispersion of the memory device 100. The imbalance caused by the physical structure of the memory device 100 will be described in greater detail below with reference to FIG. 23 to FIG. 25. However, the present disclosure is not limited to the cause of the imbalance.

When the connection between the bit line BL and the complementary bit line BLB of the sense amplifier SA is unbalanced, an error may occur in the operation of the sensing circuit 131 based on the voltage level difference between the bit line BL and the complementary bit line BLB. The error in the operation of the sensing circuit 131 caused by the imbalance in the connection to the bit line BL and the complementary bit line BLB of the sense amplifier SA will be described in greater detail with reference to FIG. 4A to FIG. 4C below.

The sensing circuit 131 according to some embodiments of the present disclosure may include a charge trap transistor CTT. In this case, the imbalance in the connection to the bit line BL and the complementary bit line BLB of the sense amplifier SA may be compensated for or mitigated based on the amount of charge trapped in the charge trap transistor CTT. Hereinafter, the configuration and operation of the sense amplifier SA that compensates for or mitigates the imbalance in the connection to the bit line BL and the complementary bit line BLB of the sensing amplifier SA based on the charge trap transistor CTT will be described.

In some embodiments, the charge trap transistor CTT may be connected to one of the bit line BL and the complementary bit line BLB.

In an embodiment, the charge trap transistor CTT may be implemented as a high-k transistor. For example, the charge trap transistor CTT may include a high dielectric layer including a high dielectric constant material (that is, high-k material) such as $ZrO_2$, $HfO_2$, $TiO_2$, $Ta_2O_5$, $La_2O_3$, $Y_2O_3$, and $Al_2O_3$. A more detailed configuration of the charge trap transistor CTT will be described in greater detail below with reference to FIG. 5.

In some embodiments, the operation of trapping charges in the charge trap transistor CTT may be referred to as a program operation. However, the present disclosure is not limited thereto.

The charge trap transistor CTT may be programmed based on the voltage levels of the bit line BL and the complementary bit line BLB. For example, the memory device 100 may provide a program voltage to the charge trap transistor CTT, based on the voltage levels of the bit line BL and the complementary bit line BLB that are amplified by a sensing operation. In this case, charges may be trapped in the charge trap transistor CTT, and the imbalance in the connection to the bit line BL and complementary bit line BLB of the sense amplifier SA may be compensated for or mitigated according to the amount of trapped charge.

In some embodiments, after the bit line BL and the complementary bit line BLB are precharged, the memory device 100 may perform (e.g., immediately perform) the sensing operation for the bit line BL and the complementary bit line BLB, e.g., without performing the memory cell activating operation. For example, the sense amplifier SA may sense and amplify the voltage levels of the precharged bit line BL and complementary bit line BLB. That is, according to some embodiments of the present disclosure, the sensing operation may be performed on the voltage levels of the precharged bit line BL and complementary bit line BLB, instead of the voltage levels of the charge-shared bit line BL and complementary bit line BLB. However, the present disclosure is not limited thereto, and various operations such as an offset cancelling operation may be performed between the precharge and sensing operations.

In some embodiments, when a sensing operation is performed on the voltage levels of the precharged bit line BL and complementary bit line BLB, the voltage level of one of the bit line BL and the complementary bit line BLB may increase to the power supply voltage, and the voltage level of the other one may decrease to the ground voltage, due to an imbalance in the connection to the bit line BL and the complementary bit line BLB of the sense amplifier SA. Accordingly, the imbalance in the connection to the bit line BL and the complementary bit line BLB of the sense amplifier SA may be identified based on the voltage levels of the amplified bit line BL and complementary bit line BLB. In this case, charges may be trapped in the charge trap transistor CTT based on the imbalance in the connection to the bit line BL and the complementary bit line BLB of the identified sense amplifier SA.

In some embodiments, the program voltage may be provided from the equalizing circuit 132. For example, the input/output circuit 140 may provide data corresponding to the voltage level of the amplified bit line BL to the control logic circuit 150, and the control logic circuit 150 may control the equalizing circuit 132 to provide a program voltage to the charge trap transistor CTT. An embodiment of providing a program voltage to the charge trap transistor CTT will be described in greater detail with reference to FIG. 22 below. However, the present disclosure is not limited to the specific method of providing a program voltage to a charge trap transistor CTT based on the voltage level of the amplified bit line BL.

A more detailed method in which the charge trap transistor CTT is programmed will be described in greater detail with reference to FIG. 5 to FIG. 9 below.

In some embodiments, after the voltage level of the bit line BL is sensed and amplified, the equalizing circuit 132 may equalize the voltage levels of the bit line BL and the complementary bit line BLB. For example, the equalizing circuit 132 may electrically connect the bit line BL and the complementary bit line BLB. However, the present disclosure is not limited thereto.

In some embodiments, a CTT register mode for identifying or detecting the imbalance in the connection to the bit line BL and the complementary bit line BLB of the sense amplifier SA and for trapping the voltage in the charge trap transistor CTT may be defined. In this case, in the CTT register mode, the memory device 100 may perform a precharge operation for the bit line BL and the complementary bit line BLB, and then may immediately perform a sensing operation without activating the word line WL and program the charge trap transistor CTT. However, the present disclosure is not limited thereto.

Figure 3:
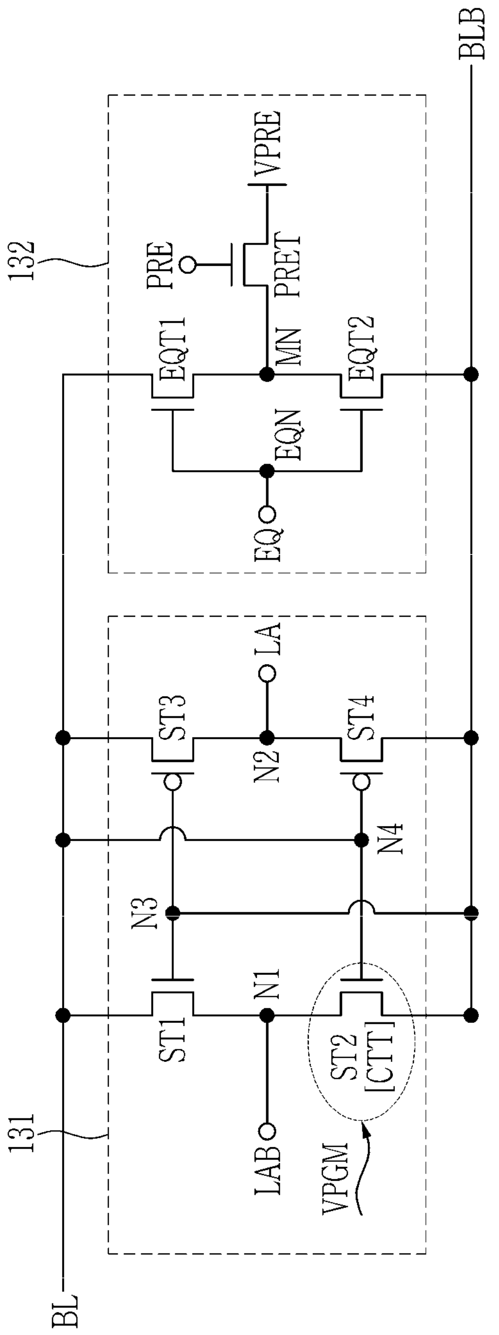
FIG. 3 illustrates a detailed circuit diagram of the sense amplifier of FIG. 2 according to some embodiments.

FIG. 3 illustrates a detailed circuit diagram of the sense amplifier of FIG. 2 according to some embodiments. Referring to FIG. 1 to FIG. 3, the sensing circuit 131 may include first to fourth sensing transistors ST1 to ST4.

The first sensing transistor ST1 may be connected between the bit line BL and a first node N1. The second sensing transistor ST2 may be connected between the complementary bit line BLB and the first node N1. The third sensing transistor ST3 may be connected between the bit line BL and a second node N2. The fourth sensing transistor ST4 may be connected between the complementary bit line BLB and the second node N2.

The first and second sensing transistors ST1 and ST2 may be implemented as N-channel transistors, and the third and fourth sensing transistors ST3 and ST4 may be implemented as P-channel transistors.

Gate terminals of the first sensing transistor ST1 and the third sensing transistor ST3 may be connected to each other through a third node N3. Gate terminals of the second sensing transistor ST2 and the fourth sensing transistor ST3 may be connected to each other through a fourth node N4.

The third node N3 may be connected to the complementary bit line BLB. The fourth node N4 may be connected to the bit line BL.

That is, the first to fourth sensing transistors ST1 to ST4 may configure a cross-coupled differential amplifier. In other words, the sensing circuit 131 may include a cross-coupled differential amplifier including the first to fourth sensing transistors ST1 to ST4.

The first node N1 may receive a first driving signal LAB. The second node N2 may receive a second driving signal LA.

The equalizing circuit 132 may include a first equalizing transistor EQT1, a second equalizing transistor EQT2, and a precharge transistor PRET.

The first equalizing transistor EQT1 may be connected between the bit line BL and an intermediate node MN. The second equalizing transistor EQT2 may be connected between the complementary bit line BLB and the intermediate node MN.

A gate terminal of the first equalizing transistor EQT1 may be connected to an equalizing node EQN. A gate terminal of the second equalizing transistor EQT2 may be connected to the equalizing node EQN. The equalizing node EQN may receive an equalizing signal EQ. That is, the first and second equalizing transistors EQT1 and EQT2 may operate in response to the equalizing signal EQ.

The precharge transistor PRET may be connected between the intermediate node and a precharge voltage VPRE. The precharge transistor PRET may operate in response to a precharge signal PRE.

In some embodiments, the precharge voltage VPRE may be lower than the power supply voltage and higher than the ground voltage (that is, between the ground voltage and the power supply voltage). Hereinafter, for a more concise description, the precharge voltage VPRE is assumed to be an intermediate value between the power supply voltage and the ground voltage. However, the present disclosure is not limited thereto.

In some embodiments, a logic high may represent a voltage level corresponding to the power supply voltage VDD, and a logic low may represent a voltage level corresponding to the ground voltage GND. However, the present disclosure is not limited thereto. For example, a logic high may represent any voltage level to turn the transistor on, and a logic low may represent any voltage level to turn the transistor off.

When a precharge operation being performed, the precharge signal PRE and the equalizing signal EQ may transition to a logic high. The first and second equalizing transistors EQT1 and EQT2 may be turned on in response to the equalizing signal EQ, and the precharge transistor PRET may be turned on in response to the precharge signal PRE. In this case, the precharge voltage VPRE may be provided to the bit line BL and the complementary bit line BLB through the intermediate node MN.

In some embodiments, while a precharge operation is being performed on the bit line BL and the complementary bit line BLB, the first driving signal LAB and the second driving signal LA may have voltage levels corresponding to the precharge voltage VPRE.

After the precharge operation is performed, both the bit line BL and the complementary bit line BLB may have voltage levels corresponding to the precharge voltage VPRE.

In some embodiments, when the sensing operation is performed under ideal or nominal conditions, a voltage level of a line having a relatively high voltage level among the bit line BL and the complementary bit line BLB may increase to the power supply voltage VDD, and a voltage level of a line having a relatively low voltage level may decrease to the ground voltage GND. Therefore, when the sensing operation is performed under the ideal or nominal conditions, the voltage levels of the precharged bit line BL and the complementary bit line BLB may be identical, such that it may not be clear which voltage level (e.g., the voltage level of the bit line BL or the complementary bit line BLB) will increase to the power supply voltage when the sensing operation is performed on the precharged bit line BL and complementary bit line BLB. (That is, when the sensing operation for the precharged bit line BL and complementary bit line BLB is performed under ideal or nominal conditions, the voltage levels of the bit line BL and the complementary bit line BLB may be in an equilibrium state, but which may be an unstable state. Therefore, the voltage levels of the bit line BL and the complementary bit line BLB will stochastically change to the power supply voltage or ground voltage, which is a bistable voltage.

However, as previously described with reference to FIG. 2, when the connection to the bit line BL and the complementary bit line BLB of the sense amplifier SA is unbalanced. As such, even if the voltage levels of the precharged bit line BL and complementary bit line BLB are identical, only one of the bit line BL and the complementary bit line BLB may transition to the power supply voltage through the sensing operation.

For example, a first RC value of the memory cell array 110 viewed through the bit line BL in the sense amplifier SA may be smaller than a second RC value of the memory cell array 110 viewed through the complementary bit line BLB in the sense amplifier SA. In this case, even if the bit line BL and the complementary bit line BLB are precharged to the same voltage, the voltage level of the complementary bit line BLB may increase to the power supply voltage and the voltage level of the bit line BL may decrease to the ground voltage as the sensing operation is performed on the precharged bit line BL and complementary bit line BLB. Conversely, when the first RC value is greater than the second RC value, the voltage level of the bit line BL may increase to the power supply voltage and the voltage level of the complementary bit line BLB may decrease to the ground voltage as the sensing operation is performed on the precharged bit line BL and complementary bit line BLB.

Hereinafter for a more concise description, examples of embodiments of compensating for or mitigating imbalance when the first RC value is smaller than the second RC value will be representatively described. However, the present disclosure is not limited thereto. For example, even when the first RC value is greater than the second RC value, the imbalance may be compensated for or mitigated in a similar manner.

In addition, hereinafter, for a more concise description, examples of embodiments in which the charge trap transistor CTT is a transistor with an N-type channel will be representatively described. However, the present disclosure is not limited thereto, and the charge trap transistor CTT may be a transistor with a P-type channel.

The second sensing transistor ST2 may operate as the charge trap transistor CTT. For example, the second sensing transistor ST2 may be implemented as a high-k transistor.

The charge trap transistor CTT may be programmed in response to a program voltage VPGM. For example, the charge trap transistor CTT may trap charge based on the program voltage VPGM. In this case, a threshold voltage of the charge trap transistor CTT may increase. Therefore, according to some embodiment of the present disclosure, the imbalance in the connection to the bit line BL and the complementary bit line BLB of the sense amplifier SA may be compensated.

Figure 4A:
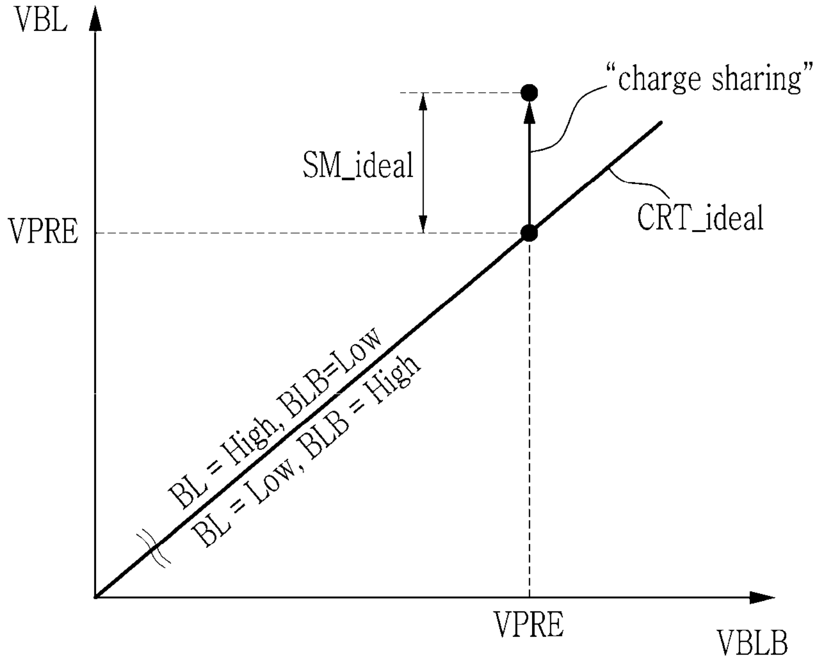
FIG. 4A, FIG. 4B, and FIG. 4C illustrate a method in which imbalance in connection to a bit line and a complementary bit line of a sense amplifier is compensated according to some embodiments of the present disclosure.
Figure 4B:
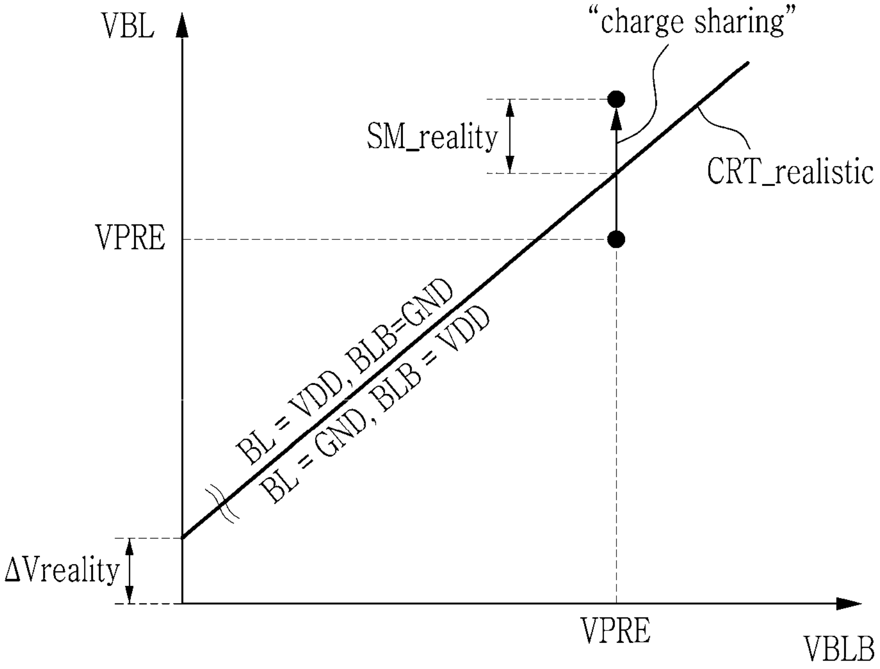
Figure 4C:
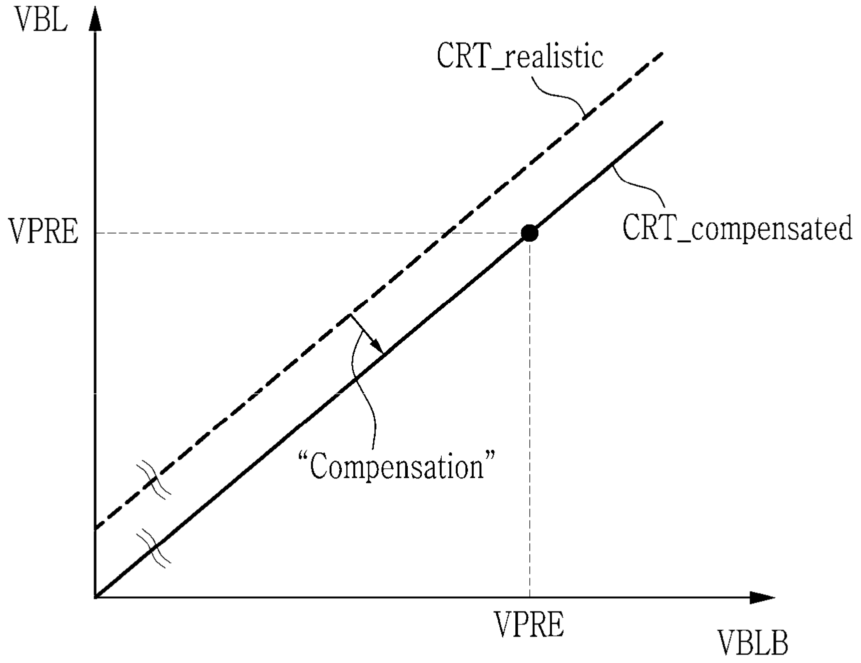

FIG. 4A to FIG. 4C illustrate a method in which imbalance in connection to a bit line and a complementary bit line of a sense amplifier is compensated for or mitigated according to some embodiments of the present disclosure. Hereinafter, a sensing operation of the sense amplifier SA according to an ideal embodiment will be described with reference to FIG. 4A, a sensing operation of the sense amplifier SA according to a non-ideal embodiment will be described with reference to FIG. 4B, and a method of compensating for or mitigating an imbalance in connection to the bit line BL and the complementary bit line BLB of the sense amplifier SA according to some embodiments of the present disclosure will be described with reference to FIG. 4C. The horizontal axis of FIG. 4A to FIG. 4C represents the complementary bit line voltage level VBLB, and the vertical axis thereof represents the bit line voltage level VBL.

First, referring to FIG. 1 to FIG. 3 and FIG. 4A, the voltage levels of the bit line BL and the complementary bit line BLB may be precharged to the same level. For example, after the precharge operation is completed, both the complementary bit line voltage level VBLB and the bit line voltage level VBL may be the precharge voltage VPRE.

Thereafter, as the word line connected to the memory cell array 110 is activated, charge sharing may occur between the bit line BL and the memory cell. For example, the voltage level of the bit line BL may finely increase or decrease based on the amount of charge stored in the memory cell. However, hereinafter, for a more concise description, an example of an embodiment in which data corresponding to '1' is stored in a memory cell connected to the bit line BL (that is, in case of a voltage higher than the precharge voltage is stored in the memory cell) will be representatively described. In this case, as the charge sharing occurs, the bit line voltage level VBL may increase, while the voltage level of the complementary bit line BLB may remain the same. That is, through the charge sharing, a potential difference may occur between the bit line BL and the complementary bit line BLB.

Thereafter, as the sensing circuit 131 performs a sensing operation, the potential difference between the bit line BL and the complementary bit line BLB may be amplified. For example, the sensing circuit 131 may amplify a voltage level of a line having a relatively high voltage level into the power supply voltage VDD and amplify a voltage level of a line having a relatively low voltage level into the ground voltage GND, by comparing the complementary bit line voltage level VBLB and the bit line voltage level VBL.

That is, when the coordinates for the complementary bit line voltage level VBLB and the bit line voltage level VBL are positioned in an area above the ideal sensing criterion CRT_ideal, the sensing circuit 131 may increase the bit line voltage level VBL to the power supply voltage VDD and decrease the complementary bit line voltage level VBLB to the ground voltage GND. On the other hand, when the coordinates for the complementary bit line voltage level VBLB and the bit line voltage level VBL are positioned in an area below the ideal sensing criterion CRT_ideal, the sensing circuit 131 may decrease the bit line voltage level VBL to the ground voltage GND and increase the complementary bit line voltage level VBLB to the power supply voltage VDD.

In this case, the sensing margin SM_ideal for comparing the voltage levels of the bit line BL and the complementary bit line BLB may correspond to the voltage level of the bit line BL increased through charge sharing.

On the other hand, referring to FIG. 1 to FIG. 3 and FIG. 4B, due to an imbalance in the connection to the bit line BL and the complementary bit line BLB of the sense amplifier SA, the sense amplifier SA may perform a sensing operation based on a non-ideal sensing criterion CRT_realistic.

For example, when the coordinates for the complementary bit line voltage level VBLB and the bit line voltage level VBL are positioned in an area above the non-ideal sensing criterion CRT_realistic, the sensing circuit 131 may increase the bit line voltage level VBL to the power supply voltage VDD and may decrease the complementary bit line voltage level VBLB to the ground voltage GND. On the other hand, when the coordinates for the complementary bit line voltage level VBLB and the bit line voltage level VBL are positioned in an area below the non-ideal sensing criterion CRT_realistic, the sensing circuit 131 may decrease the bit line voltage level VBL to the ground voltage GND and increase the complementary bit line voltage level VBLB to the power supply voltage VDD.

That is, the sense amplifier SA may increase the bit line BL to the power supply voltage VDD only when the bit line voltage level VBL is higher than the complementary bit line voltage level VBLB by '$\Delta$Vreality'. In this case, after the charge sharing occurs, the sensing margin SM_reality for comparing and amplifying the bit line voltage level VBL and the complementary bit line voltage level VBLB may decrease. For example, the sensing margin SM_reality may be smaller than the sensing margin SM_ideal by '$\Delta$Vreality'.

Accordingly, when the connection to the bit line BL and the complementary bit line BLB of the sense amplifier SA is unbalanced, the operation accuracy of the sense amplifier SA may decrease.

Next, referring to FIG. 1 to FIG. 3 and FIG. 4C, as the charge trap transistor CTT is programmed, the sense amplifier SA may perform a sensing operation based on the compensated sensing criterion CRT_compensated. That is, as the charge trap transistor CTT is programmed, the sense amplifier SA may perform a sensing operation based on the compensated sensing criterion CRT_compensated instead of the non-ideal sensing criterion CRT_realistic.

The compensated sensing criterion CRT_compensated may be substantially similar to the ideal sensing criterion CRT_ideal. Accordingly, when the charge trap transistor CTT is programmed according to some embodiments of the present disclosure, the sensing margin for the bit line voltage level VBL increased by the charge sharing may be increased or maximized, so that the sense amplifier SA may operate more accurately. The specific method of compensating the sensing criterion when the sensing amplifier SA performs the sensing operation will be described in greater detail with reference to FIG. 7 below.

Figure 5:
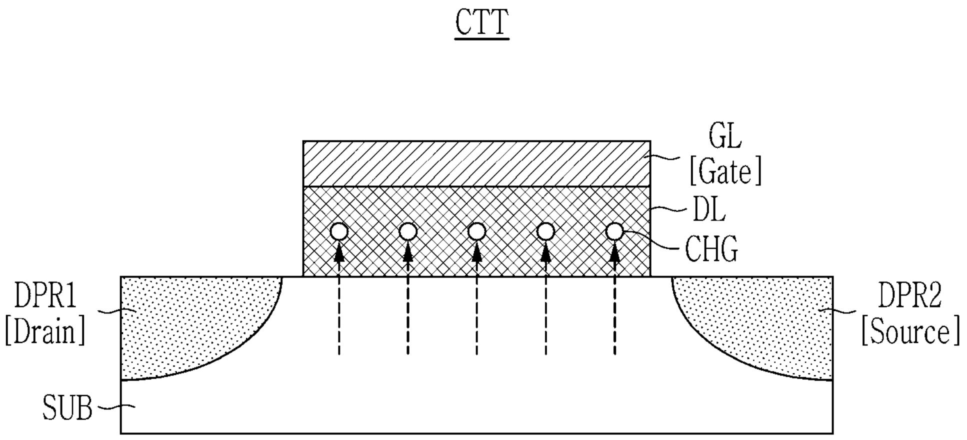
FIG. 5 illustrates a detailed diagram of a charge trap transistor of FIG. 3.

FIG. 5 illustrates a detailed diagram of a charge trap transistor of FIG. 3. Referring to FIG. 1 to FIG. 3 and FIG. 5, the charge trap transistor CTT may include a substrate SUB, a high-k dielectric layer DL, and a gate layer GL.

The high-k dielectric layer DL may be between the substrate SUB and the gate layer GL. The high-k dielectric layer DL may include one or more of various high-k materials such as $ZrO_2$, $HfO_2$, $TiO_2$, $Ta_2O_5$, $La_2O_3$, $Y_2O_3$, $Al_2O_3$, or the like.

The gate layer GL may form a gate electrode of the charge trap transistor CTT. For example, the gate layer GL may include a conductive material such as metal, metal compound, or polysilicon.

A first doped region DPR1 and a second doped region DPR2 may be included on the substrate SUB. The first doped region DPR1 may form a drain electrode of the charge trap transistor CTT. The second doped region DPR2 may form a source electrode of the charge trap transistor CTT.

In some embodiments, when the charge trap transistor CTT is implemented as a P-type transistor, the first doped region DPR1 and the second doped region DPR2 may be doped with a P-type doped material. When the charge trap transistor CTT is implemented as an N-type transistor, the first doped region DPR1 and the second doped region DPR2 may be doped with an N-type doped material. However, hereinafter, for a more concise description, an example of an embodiment in which the charge trap transistor CTT is implemented as an N-type transistor will be representatively described. However, the present disclosure is not limited thereto.

When a high voltage is applied to the drain electrode and the gate electrode of the charge trap transistor CTT, the charge CHG may be trapped in the high-k layer DL. For example, when the ground voltage is applied to the source electrode of the charge trap transistor CTT and the program voltage VPGM with a voltage level higher than the power supply voltage is applied to the gate electrode and drain electrode of the charge trap transistor CTT, the charge CHG may be trapped in the high-k dielectric layer DL. However, the present disclosure is not limited to the specific method in which the charge trap transistor CTT is programmed in response to the program voltage VPGM.

In some embodiments, when the voltage level of the drain electrode of the charge trap transistor CTT is higher than the voltage level of the source electrode thereof by about 1.5 V or more and the voltage level of the gate electrode of the charge trap transistor CTT is higher than the voltage level of the source electrode thereof by about 2.0 V or more, the charge CHG may be trapped in the high-k dielectric layer DL.

In some embodiments, the threshold voltage of the charge trap transistor CTT may be determined based on the amount of charge CHG trapped in the high-k dielectric layer DL.

In some embodiments, the amount of charge CHG trapped in the high-k dielectric layer DL may be determined according to the time when the program voltage VPGM is applied to the charge trap transistor CTT.

Figure 6:
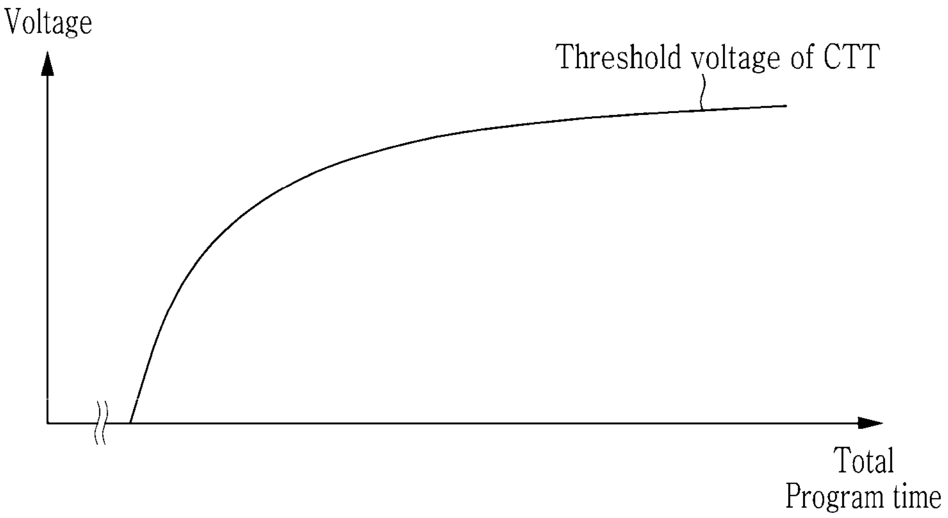
FIG. 6 illustrates a graph of a relationship between a total program time and a threshold voltage of the charge trap transistor of FIG. 5.

FIG. 6 illustrates a graph of a relationship between a total program time and a threshold voltage of the charge trap transistor of FIG. 5. The horizontal axis of FIG. 6 represents the length of time during which the program voltage VPGM is provided to the charge trap transistor CTT, and the vertical axis thereof represents the threshold voltage level of the charge trap transistor CTT.

Referring to FIG. 1 to FIG. 3, FIG. 5, and FIG. 6, the threshold voltage of the charge trap transistor CTT may increase according to the time that the program voltage VPGM is applied to the charge trap transistor CTT. For example, the threshold voltage of the charge trap transistor CTT may increase logarithmically according to the time that the program voltage VPGM is applied to the charge trap transistor CTT.

Therefore, according to some embodiments of the present disclosure, depending on the total time for applying the program voltage VPGM to the charge trap transistor CTT, the degree to which the imbalance in the connection to the bit line BL and the complementary bit line BLB of the sense amplifier SA is compensated for or mitigated may be adjusted. For example, by applying the program voltage VPGM to the charge trap transistor CTT over a plurality of unit program times, the imbalance in the connection to the bit line BL and the complementary bit line BLB of the sense amplifier SA may be adjusted relatively finely.

More specifically, in the memory device 100, the imbalance in the connection to the bit line BL and the complementary bit line BLB of the sense amplifier SA may be adjusted (e.g., finely adjusted) by repeatedly performing an operation of determining whether the imbalance in the connection to the bit line BL and the complementary bit line BLB of the sense amplifier SA has been compensated for or mitigated sufficiently, after applying the program voltage VPGM to the charge trap transistor CTT for a single unit program time.

Figure 7:
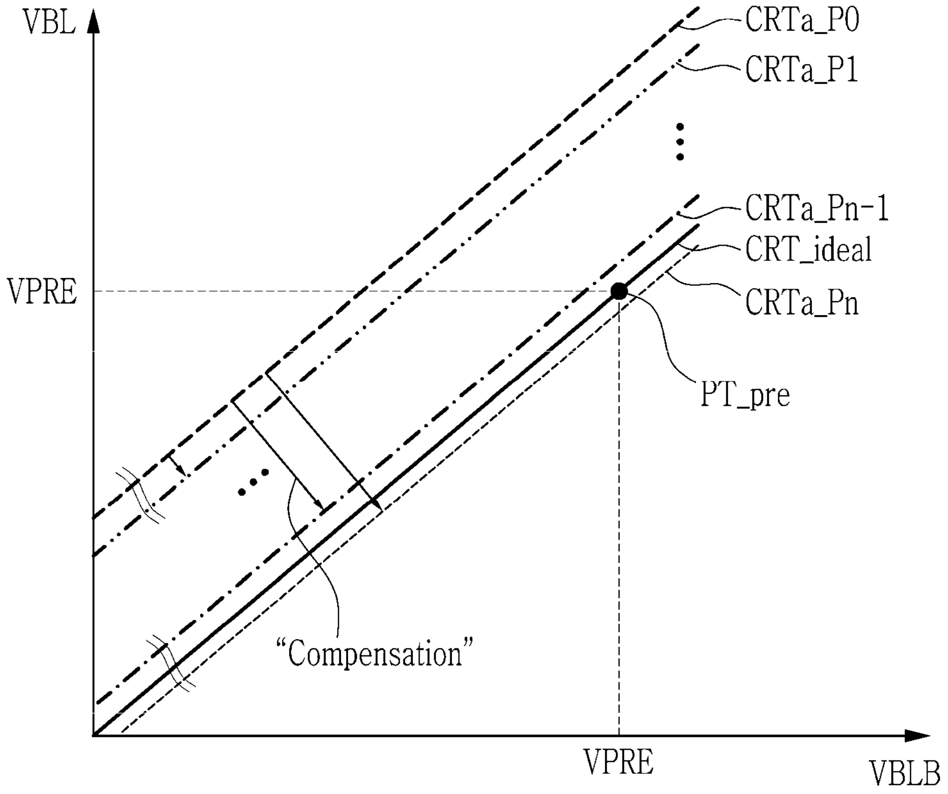
FIG. 7 illustrates a sensing criterion of a sense amplifier according to the number of programs of the charge trap transistor of FIG. 3.

FIG. 7 illustrates a sensing criterion of a sense amplifier according to the number of programs of the charge trap transistor of FIG. 3. The horizontal axis of FIG. 7 represents the complementary bit line voltage level VBLB, and the vertical axis thereof represents the bit line voltage level VBL.

Referring to FIG. 1 to FIG. 7, the charge trap transistor CTT may be programmed step by step (e.g., incrementally) by receiving the program voltage VPGM multiple times for each single unit program time.

First, when the charge trap transistor CTT is not programmed (that is, when the charge trap transistor CTT has been programmed '0' times or zero times), the sense amplifier SA may perform a sensing operation based on a 0-th sensing criterion CRTa_P0. For example, the sense amplifier SA may perform a sensing operation for the precharged bit line BL and complementary bit line BLB based on the 0-th sensing criterion CRTa_P0. In this case, since the coordinates for the precharged complementary bit line voltage level VBLB and the precharged bit line voltage level VBL (hereinafter, for a more concise description, the coordinates are referred to as a precharge point PT_pre) is positioned in an area below the 0-th sensing criterion CRTa_P0, the sensing circuit 131 may decrease the bit line voltage level VBL to the ground voltage GND and may increase the complementary bit line voltage level VBLB to the power supply voltage VDD.

In some embodiments, the 0-th sensing criterion CRTa_P0 may correspond to the non-ideal sensing criterion CRT_realistic described above with reference to FIG. 4B. However, the present disclosure is not limited thereto.

Thereafter, as the bit line BL transitions to logic low, the sense amplifier SA may provide the program voltage VPGM to the charge trap transistor CTT for a unit program time.

When the charge trap transistor CTT is programmed for a first unit program time (that is, when the charge trap transistor CTT is programmed over '1' unit program time), the sense amplifier SA may perform a sensing operation based on the first sensing criterion CRTa_P1. For example, the sensing circuit 131 may decrease the bit line voltage level VBL to the ground voltage GND and may increase the complementary bit line voltage level VBLB to the power supply voltage VDD, similar to that previously described.

In the embodiment, as compared to the case in which the sensing operation is performed on the bit line BL increased through the charge sharing based on the 0-th sensing criterion CRTa_P0, when the sensing operation is performed on the bit line BL increased through the charge sharing based on the first sensing criterion CRTa_P1, the sensing margin of the sense amplifier SA may be relatively large.

Thereafter, as the bit line voltage level VBL decreases to the ground voltage, the sense amplifier SA may provide the program voltage VPGM to the charge trap transistor CTT for a unit program time.

In this way, in response to the decreasing of the bit line voltage level VBL to the ground voltage GND through the sensing operation, the sensing amplifier SA may provide the program voltage VPGM to the charge trap transistor CTT (for example, the second sensing transistor ST2) for a unit program time. In this case, as the number of times the program voltage VPGM is provided to the charge trap transistor CTT increases, the sensing criterion for which the sense amplifier SA performs the sensing operation may approach to and/or become similar to the ideal sensing criterion CRT_ideal.

For example, when the charge trap transistor CTT is programmed '(n−1) times' for each unit program time, the sense amplifier SA may perform a sensing operation based on the (n−1)-th sensing criterion CRTa_Pn−1. In this case, since the precharge point PT_pre is positioned in an area below the (n−1)-th sensing criterion CRTa_Pn−1, the sensing circuit 131 may decrease the bit line voltage level VBL to the ground voltage GND and may increase the complementary bit line voltage level VBLB to the power supply voltage VDD.

Thereafter, when the charge trap transistor CTT is programmed 'one more time' for a unit time (that is, when the charge trap transistor CTT is programmed with 'n' unit program times), the sense amplifier SA may perform a sensing operation based on the n-th sensing criterion CRTa_Pn. However, in this case, unlike the previously performed sensing operation based on the first to (n−1)-th sensing criteria CRTa_P1 to CRTa_Pn−1, since the precharge point PT_pre is positioned in the area above the n-th sensing criterion CRTa_Pn, the bit line voltage level VBL may be increased to the power supply voltage VDD and the complementary bit line voltage level VBLB may be decreased to the ground voltage GND.

That is, unlike the case in which the charge trap transistor CTT is programmed 'n−1' unit program times, when the charge trap transistor CTT is programmed 'n' unit program times, the bit line voltage level VBL may increase to the power supply voltage VDD as the sensing operation is performed.

When the bit line voltage level VBL increases to the power supply voltage VDD, the sense amplifier SA may terminate the program operation for the charge trap transistor CTT. For example, the sense amplifier SA may discontinue and may not provide the program voltage VPGM to the charge trap transistor CTT after the sensing operation is performed based on the n-th sensing criterion CRTa_Pn. In this case, the n-th sensing criterion CRTa_Pn may correspond to the compensated sensing criterion CRT_compensated described above with reference to FIG. 4C.

In some embodiments, when the sense amplifier SA performs a sensing operation based on the (n−1)-th sensing criterion CRTa_Pn−1, there may be a relatively greater tendency to transition the complementary bit line BLB to logic high as compared to the case in which the sense amplifier SA operates based on the ideal sensing criterion CRT_ideal. Conversely, when the sense amplifier SA performs a sensing operation based on the n-th sensing criterion CRTa_Pn, there may be a relatively greater tendency to transition the bit line BL to logic high as compared to the case in which the sense amplifier SA operates based on the ideal sensing criterion CRT_ideal. That is, the ideal sensing criterion CRT_ideal may be positioned between the (n−1)-th sensing criterion CRTa_Pn−1 and the n-th sensing criterion CRTa_Pn.

The unit program time may be relatively short (e.g., sufficiently short). Accordingly, the amount of change in the threshold voltage of the charge trap transistor CTT in response to the provision of the program voltage VPGM for the single unit program time may be relatively small (e.g., very small). In this case, the (n−1)-th sensing criterion CRTa_Pn−1 and the n-th sensing criterion CRTa_Pn may be substantially similar. Accordingly, the n-th sensing criterion CRTa_Pn (that is, the compensated sensing criterion CRT_compensated) may be extremely similar to (e.g., identical to or nearly identical to) the ideal sensing criterion CRT_ideal.

Therefore, according to some embodiments of the present disclosure, by programming the charge trap transistor CTT, the sense amplifier SA may perform a sensing operation based on the compensated sensing criterion CRT_compensated which may be extremely similar to the ideal sensing criterion CRT_ideal. In this case, since the imbalance with respect to the bit line BL and the complementary bit line BLB of the sense amplifier SA may be finely compensated, the sensing margin of the sense amplifier SA may be increased or maximized.

Figure 8:
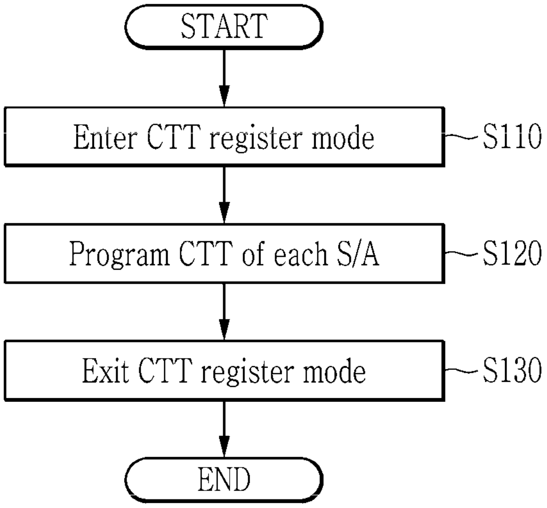
FIG. 8 illustrates a flowchart of an operation of the memory device of FIG. 1.

FIG. 8 illustrates a flowchart of operations of the memory device of FIG. 1. Referring to FIG. 1 to FIG. 3 and FIG. 8, in operation S110, the memory device 100 may enter a CTT register mode. For example, the memory device 100 may enter the CTT register mode from an idle state. In this case, the memory device 100 may perform a precharge operation for the bit line BL and the complementary bit line BLB, and then may immediately perform a sensing operation without activating a word line WL.

In operation S120, the memory device 100 may program the charge trap transistor CTT of each sense amplifier SA. For example, the memory device 100 may provide the program voltage VPGM to the charge trap transistor CTT included in each sense amplifier SA. A method of programming the charge trap transistor CTT by the memory device 100 will be described in greater detail with reference to FIG. 9.

In some embodiments, the memory device 100 may provide the program voltage VPGM to the charge trap transistor CTT of each of a plurality of sense amplifiers SA included in the sense amplifier array 130 for a different number of times. For example, the memory device 100 may provide the program voltage VPGM a different number of times for each charge trap transistor CTT included in each sense amplifier SA. However, the present disclosure is not limited thereto.

In operation S130, the memory device 100 may exit the CTT register mode. For example, the memory device 100 may enter an idle state from the CTT register mode. However, the present disclosure is not limited thereto.

In some embodiments, operations S110 to S130 described above may be performed once (e.g., only once) in a production step or a setup step of the memory device 100. However, the present disclosure is not limited thereto.

Figure 9:
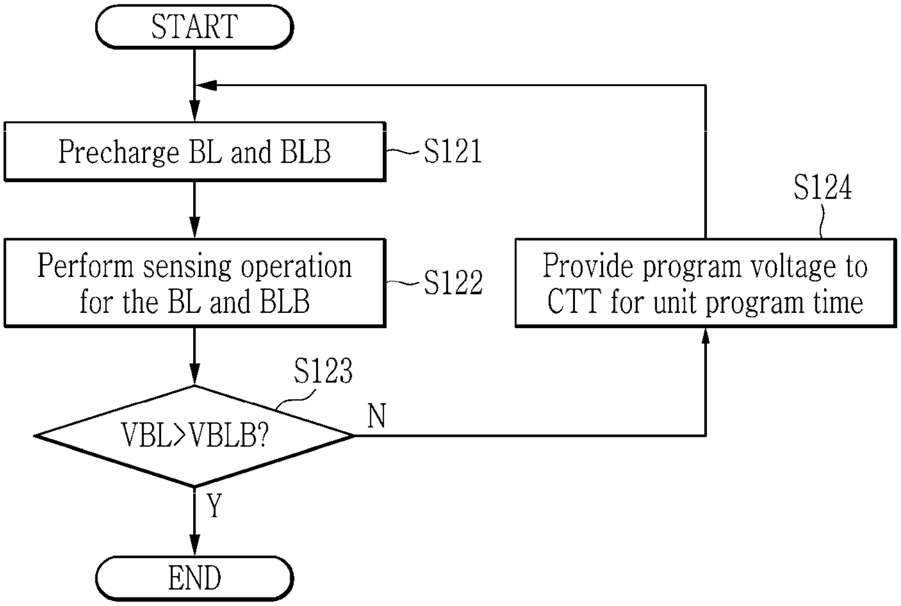
FIG. 9 illustrates a detailed flowchart of step S120 of FIG. 8.

FIG. 9 illustrates a detailed flowchart of operation S120 of FIG. 8. Referring to FIG. 1 to FIG. 3 and FIG. 8 to FIG. 9, in operation S121, the memory device 100 may precharge the bit line BL and the complementary bit line BLB. For example, the equalizing circuit 132 may provide the precharge voltage VPRE to the bit line BL and the complementary bit line BLB.

In operation S122, the memory device 100 may perform a sensing operation for the bit line BL and the complementary bit line BLB. For example, the sensing circuit 131 may increase or decrease the voltage level of each of the precharged bit line BL and complementary bit line BLB to a bistable voltage. That is, the sensing circuit 131 may increase one of the voltage levels of the precharged bit line BL and complementary bit line BLB, to the power supply voltage and may decrease the other of the voltage levels thereof to the ground voltage.

That is, according to some embodiments of the present disclosure, after the bit line BL and the complementary bit line BLB are precharged, the sensing operation may be performed immediately without charge sharing for the memory cell.

In operation S123, the memory device 100 may determine whether the bit line voltage level VBL is higher than the complementary bit line voltage level VBLB. For example, the memory device 100 may determine whether the bit line voltage level VBL is the power supply voltage.

When the bit line voltage level VBL is lower than or equal to the complementary bit line voltage level VBLB ("N" branch from operation S123), operation S124 below may be performed.

In operation S124, the memory device 100 may provide the program voltage VPGM to the charge trap transistor CTT for a unit program time. For example, the memory device 100 may provide the program voltage VPGM to the charge trap transistor CTT for a unit program time. For example, the memory device 100 may program the second sensing transistor ST2 by providing the program voltage VPGM to the second sensing transistor ST2 for a unit program time.

After step S124 is performed, operations S121, S122, and S123 described above may be repeatedly performed. In this way, the memory device 100 may perform (e.g., repeatedly perform) the step of providing the program voltage VPGM to the charge trap transistor CTT for each unit program time. In this case, each time operation S124 is performed, the amount of charge trapped in the charge trap transistor CTT may gradually increase. Accordingly, similar to the above description with reference to FIG. 7, the criterion for performing the sensing operation by the sense amplifier SA may vary according to the number of times operation S124 is performed, so that the imbalance in the connection to the bit line BL and the complementary bit line BLB of the sense amplifier SA may be compensated for or mitigated relatively accurately.

Meanwhile, in operation S123, when the voltage level of the bit line BL is higher than the voltage level of the complementary bit line BLB ("Y" branch from operation S123), the program operation for the charge trap transistor CTT may exit. For example, the memory device 100 may execute operation S130 described above.

In some embodiments, after operation S130 is performed, the sense amplifier SA may perform the sensing operation based on the compensated sensing criterion CRT_compensated. For example, the sense amplifier SA may perform the sense operation based on the compensated sensing criterion CRT_compensated for the bit line voltage level VBL and the complementary bit line voltage level VBLB after the precharge operation and charge sharing are completed. In this case, as previously described with reference to FIG. 7, the sensing margin of the sense amplifier SA may be increased or maximized.

Figure 10:
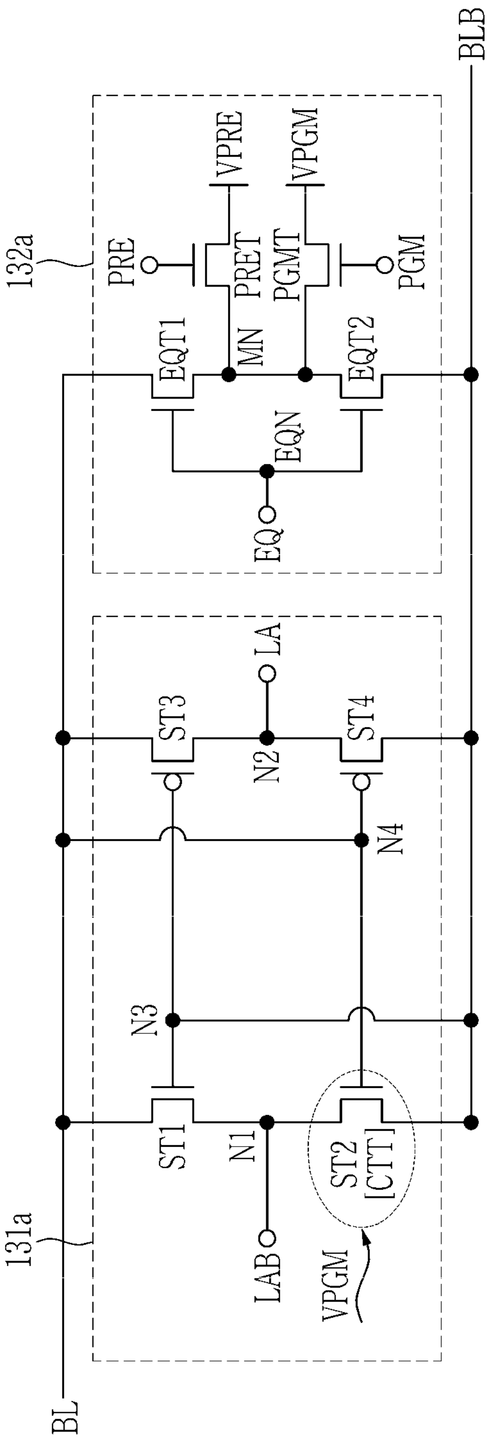
FIG. 10 illustrates a detailed circuit diagram of the sense amplifier of FIG. 3, which is implemented according to some embodiments of the present disclosure.

FIG. 10 illustrates a detailed circuit diagram of the sense amplifier of FIG. 3, which may be implemented according to some embodiments. Referring to FIG. 1 to FIG. 3 and FIG. 10, the sensing circuit 131 may be implemented as a sensing circuit 131*a*, and the equalizing circuit 132 may be implemented as an equalizing circuit 132*a*.

The sensing circuit 131*a* may include first to fourth sensing transistors ST1 to ST4. The equalizing circuit 132*a* may include a first equalizing transistor EQT1, a second equalizing transistor EQT2, and a precharge transistor PRET. The configurations and operations of the first to fourth sensing transistors ST1 to ST4, the first equalizing transistor EQT1, the second equalizing transistor EQT2, and the precharge transistor PRET are similar to those described with reference to FIG. 3, so detailed descriptions thereof will be omitted here in the interest of brevity.

The equalizing circuit 132*a* may further include a program transistor PGMT. The program transistor PGMT may be connected between an intermediate node MN and a program voltage VPGM.

The program transistor PGMT may provide the program voltage VPGM to the charge trap transistor CTT in response to a program signal PGM. For example, when a program operation is performed for the charge trap transistor CTT, the program transistor PGMT may be turned on in response to the program signal PGM, the first and second equalizing transistors EQT1 and EQT2 may be turned on in response to an equalizing signal EQ, and the precharge transistor PRET may be turned on in response to a precharge signal PRE. In this case, the voltage levels of the intermediate node MN, the bit line BL, and the complementary bit line BLB may increase to the program voltage VPGM.

When the voltage levels of the bit line BL and the complementary bit line BLB increase to the program voltage VPGM, the voltage level of the fourth node N4 may also increase to the program voltage VPGM. Therefore, a relatively high voltage (e.g., the program voltage VPGM) that is greater than the power supply voltage may be provided to the gate terminal (that is, the fourth node N4) and the drain terminal (that is, the complementary bit line BLB) of the charge trap transistor CTT.

When a relatively high voltage is provided to the gate and drain terminals of the charge trap transistor CTT, charges may be trapped in the high-k dielectric layer DL of the charge trap transistor CTT, similar to that described with reference to FIG. 5, and thus the threshold voltage of the charge trap transistor CTT may increase. Therefore, according to some embodiments of the present disclosure in accordance with FIG. 10, the imbalance in the connection to the bit line BL and the complementary bit line BLB of the sense amplifier SA may be compensated for or mitigated.

In some embodiments, when the first sensing transistor ST1 is implemented as a high-k transistor, a protection transistor PTT may be further included between the third node N3 and the complementary bit line BLB. An example of an embodiment in which the first sensing transistor ST1 is implemented as a high-k transistor will be described in greater detail with reference to FIG. 12 and FIG. 13 below.

Figure 11:
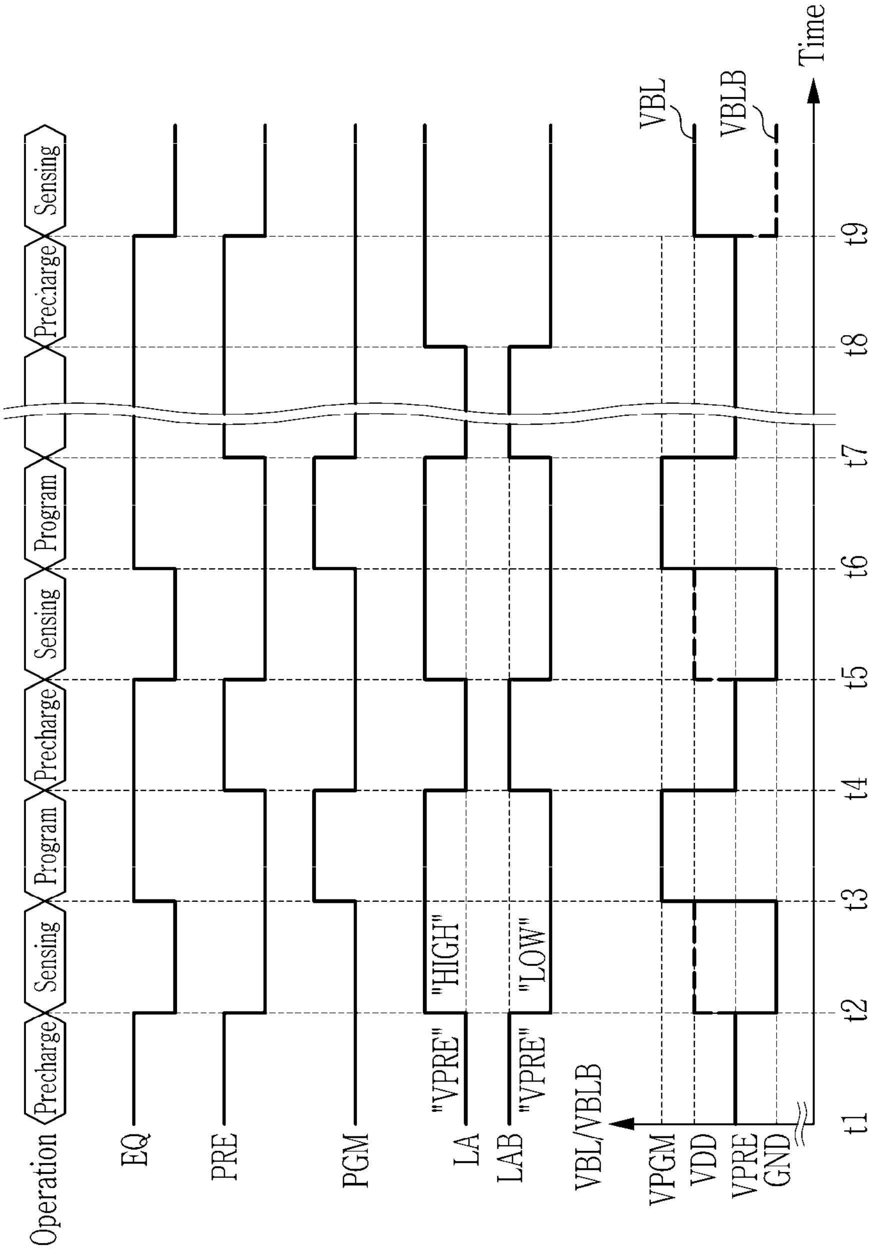
FIG. 11 illustrates a timing diagram of an operation of the sense amplifier of FIG. 10.

FIG. 11 illustrates a timing diagram of an operation of the sense amplifier of FIG. 10. Referring to FIG. 1 to FIG. 3, FIG. 10, and FIG. 11, during the first time point t1 to the second time point t2, the sense amplifier SA may perform a precharge operation (Precharge). For example, during the first time point t1 to the second time point t2, the equalizing signal EQ and the precharge signal PRE may be logic high, and the program signal PGM may be logic low. In this case, the voltage levels of the bit line BL and the complementary bit line BLB may correspond to the precharge voltage VPRE.

In some embodiments, while the precharge operation (Precharge) is performed, the first driving signal LAB and the second driving signal LA may have a voltage level corresponding to the precharge voltage VPRE. However, the present disclosure is not limited thereto.

During the second time point t2 to the third time point t3, the sense amplifier SA may perform a sensing operation (Sensing). For example, during the second time point t2 to the third time point t3, the first driving signal LAB and the second driving signal LA may be logic high, and the equalizing signal EQ may be logic low.

In some embodiments, while the sensing operation (Sensing) is performed, the precharge signal PRE and the program signal PGM may be logic low. However, the present disclosure is not limited thereto.

In some embodiments, when the connection to the bit line BL and the complementary bit line BLB of the sense amplifier SA is unbalanced, the sense amplifier SA may not perform the sensing operation based on the ideal sensing criterion CRT_ideal. That is, the sense amplifier SA may perform the sensing operation based on the non-ideal sensing criterion CRT_realistic (for example, the 0-th sensing criterion CRTa_P0) during the second time point t2 to the third time point t3. In this case, even if the bit line voltage level VBL and the complementary bit line voltage level VBLB have the same voltage level during the first time point t1 to the second time point t2, the voltage level of the bit line BL may increase to the power supply voltage VDD during the second time point t2 to the third time point t3.

During the third time point t3 to the fourth time point t4, the sense amplifier SA may perform a program operation (Program). For example, during the third time point t3 to the fourth time point t4, the equalizing signal EQ and the program signal PGM may be logic high, and the precharge signal PRE may be logic low. In this case, the voltage levels of the bit line BL and the complementary bit line BLB may increase to the program voltage VPGM. Accordingly, a relatively or comparatively high voltage may be provided to the gate and drain terminals of the second sensing transistor ST2, and the second sensing transistor ST2 may be programmed.

In some embodiments, while the program operation (Program) is performed, the first driving signal LAB may be logic low and the second driving signal LA may be logic high. However, the present disclosure is not limited thereto.

In some embodiments, a time interval between the third time point t3 and the fourth time point t4 may be a 'unit program time'.

In some embodiments, while the program operation (Program) is performed, the equalizing signal EQ may have a voltage level higher than the power supply voltage. However, the present disclosure is not limited thereto.

After the fourth time point t4, the sense amplifier SA may repeatedly program the second sensing transistor ST2, similar to the first time point t1 to the fourth time point t4. For example, the sense amplifier SA may perform a precharge operation (Precharge) during the fourth time point t4 to the fifth time point t5, the sense amplifier SA may perform a sensing operation (Sensing) during the fifth time point t5 to the sixth time point t6, and the sense amplifier SA may perform a program operation (Program) during the sixth time point t6 to the seventh time point t. In this way, the sense amplifier SA may repeatedly program the second sensing transistor ST2. In this case, as described with reference to FIG. 7B and FIG. 7C, as the second sensing transistor ST2 is programmed repeatedly, the sensing criterion of the sense amplifier SA will gradually become similar to or approximate the ideal sensing criterion CRT_ideal.

In some embodiments, a time interval between the sixth time point t6 and the seventh time point t7 may be a 'unit program time'. That is, the time interval between the sixth time point t6 and the seventh time point t7 may be the same as the time interval between the third time point t3 and the fourth time point t4. In this way, the sense amplifier SA may repeatedly program the second sensing transistor ST2 for each 'unit program time'. However, the present disclosure is not limited thereto.

In some embodiments, the precharge operation (Precharge), the sensing operation (Sensing), and the program operation (Program) may together be regarded as one program cycle. For example, the first time point t1 to the fourth time point t4 may be referred to as a first program cycle, and the fourth time point t4 to the seventh time point t7 may be referred to as a second program cycle. That is, the sense amplifier SA may repeatedly perform a plurality of program cycles to program the charge trap transistor CTT. However, the present disclosure is not limited thereto.

However, even if the second sensing transistor ST2 is repeatedly programmed, the voltage level of the complementary bit line BLB may increase to the power supply voltage VDD and the voltage level of the bit line BL may decrease to the ground voltage GND, each time the sensing operation is performed before the eighth time point t8. For example, similar to that previously described with reference to FIG. 7, when the sensing operation is performed for the precharged bit line BL and complementary bit line BLB until the second sensing transistor ST2 is programmed 'n−1' times, the voltage level of the complementary bit line BLB may increase to the power supply voltage VDD, and the voltage level of the bit line BL may decrease to the ground voltage GND.

Thereafter, during the eighth time point t8 to the ninth time point t9, the sense amplifier SA may perform the precharge operation (Precharge). For example, during the eighth time point t8 to the ninth time point t9, the equalizing signal EQ and the precharge signal PRE may be logic high, and the program signal PGM may be logic low.

After the ninth time point t9, the sense amplifier SA may perform the sensing operation (Sensing). In this case, even if the bit line voltage level VBL and the complementary bit line voltage level VBLB have the same voltage level during the eighth time point t8 to the ninth time point t9, the voltage level of the bit line BL may increase to the power supply voltage VDD after the ninth time point t9. That is, unlike the sensing operations (Sensing) performed between the first time point t1 to the eighth time point t8, after the ninth time point t9, the voltage level of the complementary bit line BLB may decrease to the ground voltage GND, and the voltage level of the bit line BL may increase to the power supply voltage VDD.

In some embodiments, when the voltage level of the bit line BL is increased to the power supply voltage VDD as the sensing operation is performed, similar to that previously described with reference to FIG. 7, the sense amplifier SA may be in a state capable of performing the sensing operation based on a sensing criterion that is considerably similar to or approximate the ideal sensing criterion CRT_ideal. In other words, the charge trap transistor CTT may be in a state of trapping an amount of charge sufficient for the sense amplifier SA to perform the sensing operation in a manner similar to the ideal sensing criterion CRT_ideal. That is, in this case, the imbalance in the connection to the bit line BL and the complementary bit line BLB of the sense amplifier SA may be sufficiently compensated for or mitigated according to the amount of charge trapped in the charge trap transistor CTT. Accordingly, after the ninth time point t9, the sense amplifier SA may exit the program operation for the charge trap transistor CTT.

Figure 12:
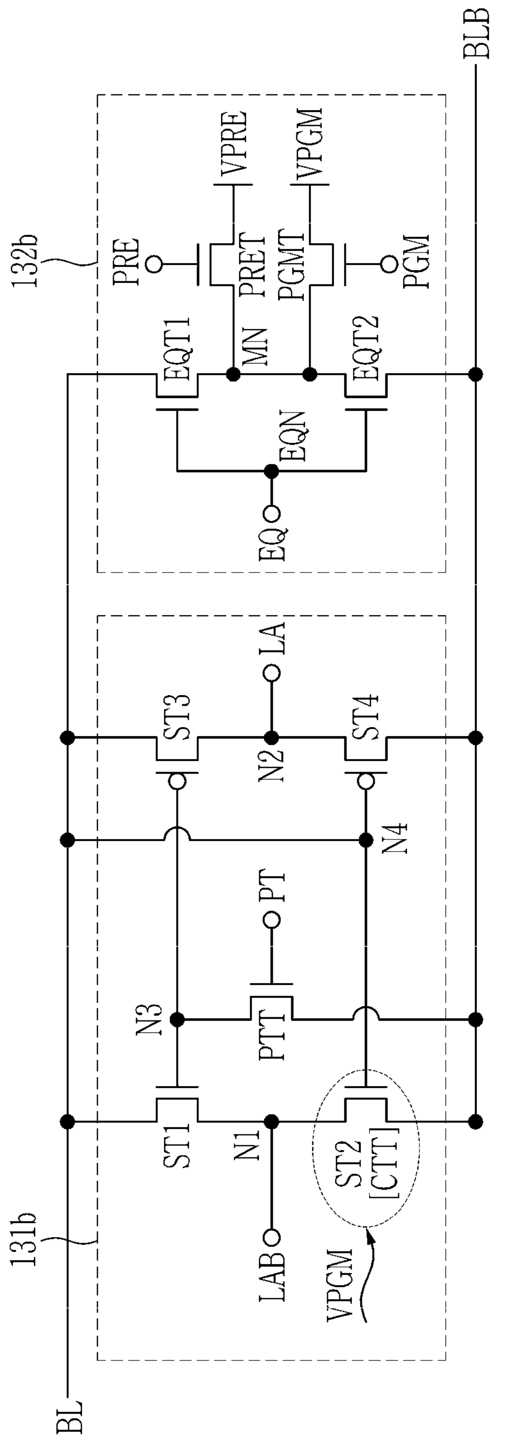
FIG. 12 illustrates a detailed circuit diagram of the sense amplifier of FIG. 3, which is implemented according to some embodiments of the present disclosure.

FIG. 12 illustrates a detailed circuit diagram of the sense amplifier of FIG. 3, which may be implemented according to some embodiments. Referring to FIG. 1 to FIG. 3 and FIG. 12, the sensing circuit 131 may be implemented as a sensing circuit 131*b*, and the equalizing circuit 132 may be implemented as an equalizing circuit 132*b*.

The sensing circuit 131*b* may include first to fourth sensing transistors ST1 to ST4. The equalizing circuit 132*b* may include a first equalizing transistor EQT1, a second equalizing transistor EQT2, a precharge transistor PRET, and a program transistor PGMT. The configurations and operations of the first to fourth sensing transistors ST1 to ST4, the first equalizing transistor EQT1, the second equalizing transistor EQT2, the precharge transistor PRET, and the program transistor PGMT are similar to those previously described with reference to FIG. 3 and FIG. 10, so detailed descriptions thereof will be omitted here in the interest of brevity.

The sensing circuit 131*a* may further include a protection transistor PTT. The protection transistor PTT may be connected between the third node N3 and the complementary bit line BLB.

The protection transistor PTT may operate in response to a protection signal PT. The protection transistor PTT may be turned off while the program operation is performed for the charge trap transistor CTT. In this case, even if the program voltage VPGM is provided to the bit line BL and the complementary bit line BLB, the program voltage VPGM may not be provided to the gate terminal (that is, the third node N3) of the first sensing transistor ST1. In this case, even if the first sensing transistor ST1 is implemented as a high-k transistor, the program operation may be performed only on the second sensing transistor ST2.

Figure 13:
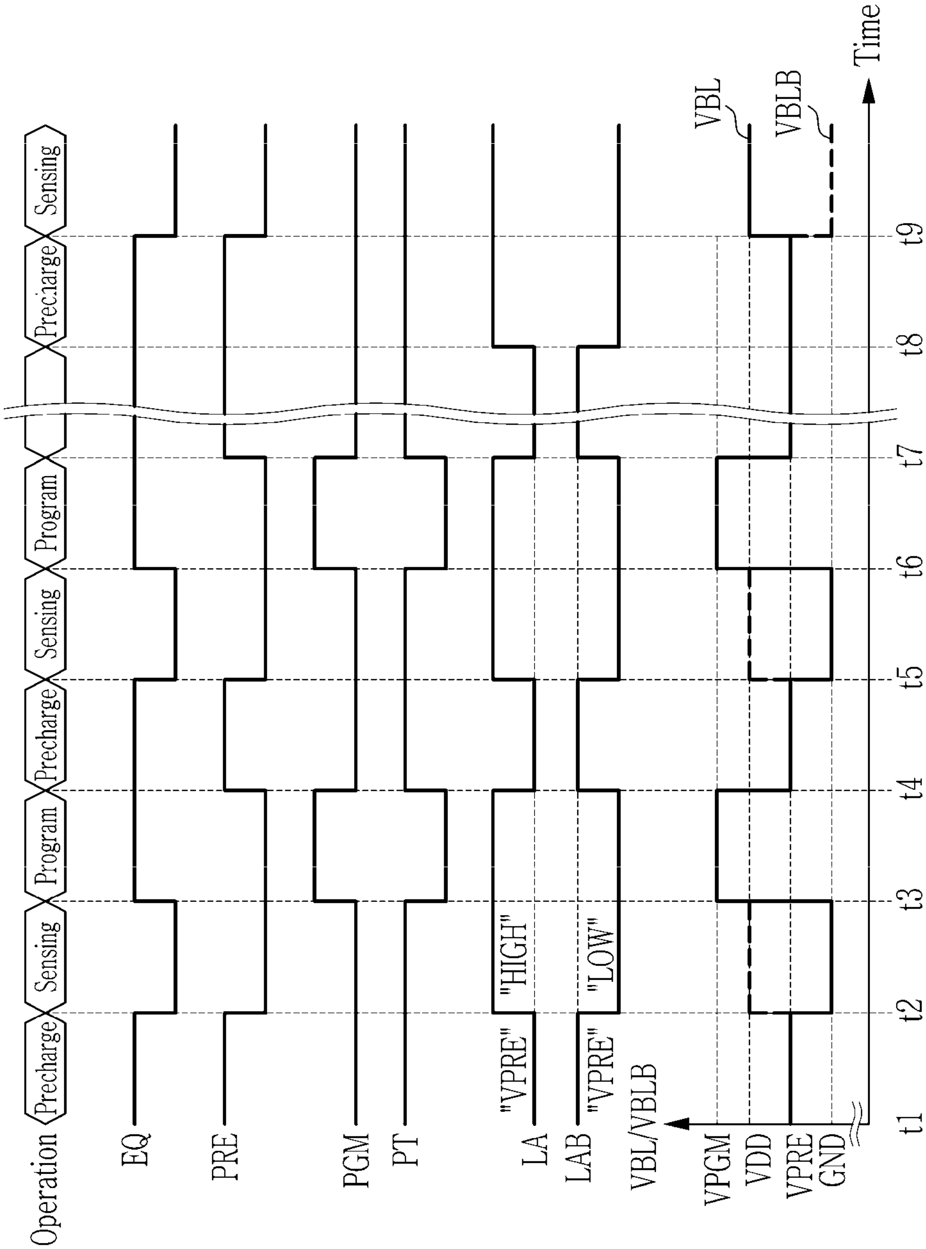
FIG. 13 illustrates a timing diagram of an operation of the sense amplifier of FIG. 12.

FIG. 13 illustrates a timing diagram of an operation of the sense amplifier of FIG. 12. Referring to FIG. 1 to FIG. 3, FIG. 12, and FIG. 13, during the first time point t1 to the eighth time point t8, the sense amplifier SA may perform a plurality of program cycles. That is, the sense amplifier SA may repeatedly perform a precharge operation (Precharge), a sensing operation (Sensing), and a program operation (Program) during the first time point t1 to the eighth time point t8. The method in which the sense amplifier SA performs the precharge operation (Precharge) and the sensing operation (Sensing) may be similar to that previously described with reference to FIG. 11, so detailed descriptions thereof will be omitted here in the interest of brevity.

When the sense amplifier SA performs the program operation (Program), the protection signal PT may be logic low. For example, the protection signal PT may be logic low between the third time point t3 and the fourth time point t4 and between the sixth time t6 and the seventh time t7. In this case, since the protection transistor PTT is turned off while the program operation (Program) is performed, the program voltage (VPGM) may not be provided to the gate terminal (that is, the third node N3) of the first sensing transistor ST1. Accordingly, even if the first sensing transistor ST1 is implemented as a high-k transistor, the program operation may be selectively performed only for the second sensing transistor ST2.

In some embodiments, when the sense amplifier SA performs the precharge operation (Precharge) or the sensing operation (Sensing), the protection signal PT may be logic high. In this case, the third node N3 may be electrically connected to the complementary bit line BLB while the sense amplifier SA performs the precharge operation (Precharge) or the sensing operation (Sensing). However, the present disclosure is not limited thereto.

In some embodiments, while the program operation (Program) is performed, the protection signal PT may have a voltage level higher than the power supply voltage. However, the present disclosure is not limited thereto.

Figure 14:
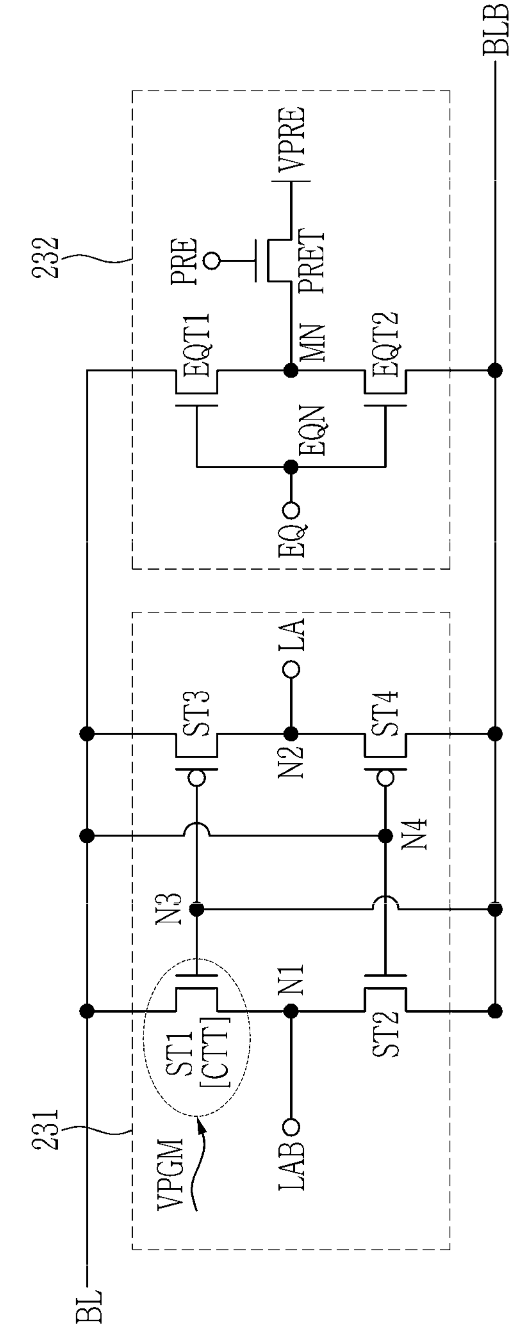
FIG. 14 illustrates the sense amplifier of FIG. 2 implemented according to some embodiments of the present disclosure.

FIG. 14 illustrates the sense amplifier of FIG. 2 implemented according to some embodiments. Referring to FIG. 1, FIG. 2, and FIG. 14, the sensing circuit 131 may be implemented as a sensing circuit 231, and the equalizing circuit 132 may be implemented as an equalizing circuit 232.

The sensing circuit 231 may include first to fourth sensing transistors ST1 to ST4. The equalizing circuit 232 may include a first equalizing transistor EQT1, a second equalizing transistor EQT2, and a precharge transistor PRET. The configurations and operations of the first to fourth sensing transistors ST1 to ST4, the first equalizing transistor EQT1, the second equalizing transistor EQT2, and the precharge transistor PRET may be similar to those previously described with reference to FIG. 3, so detailed descriptions thereof will be omitted here in the interest of brevity.

The first sensing transistor ST1 may operate as the charge trap transistor CTT. For example, the first sensing transistor ST1 may be implemented as a high-k transistor. That is, in contrast to that previously described with reference to FIG. 3, the first sensing transistor ST1 may be programmed in response to the program voltage VPGM.

Figure 15:
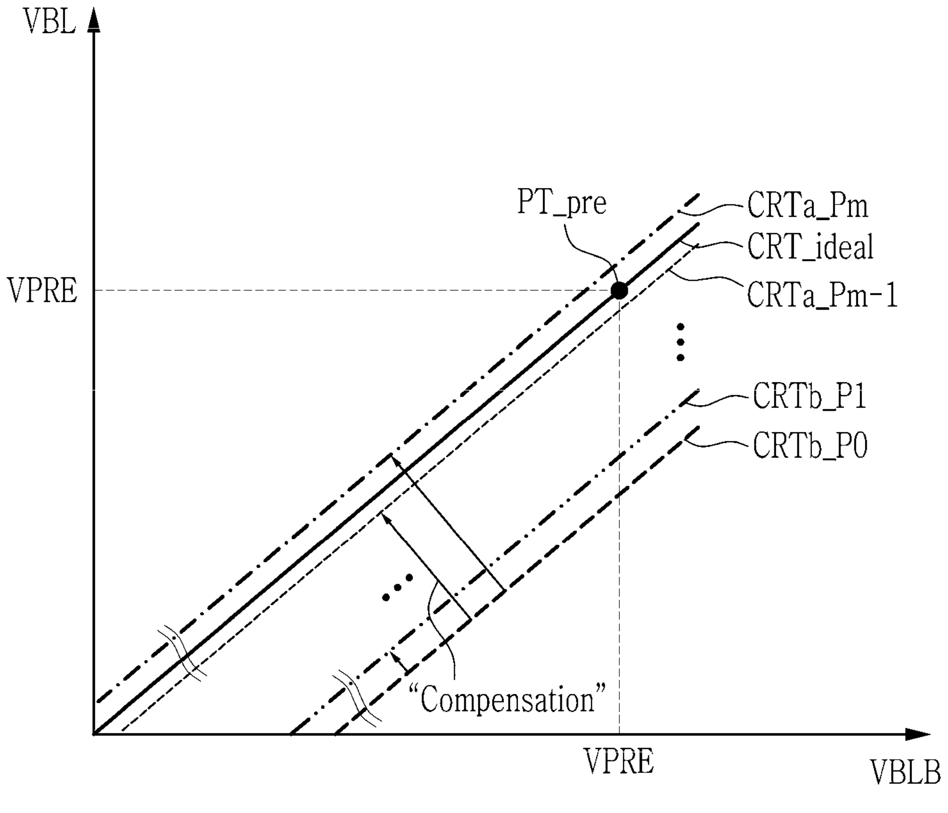
FIG. 15 illustrates a sensing criterion of a sense amplifier according to the number of programs of the charge trap transistor of FIG. 14.

FIG. 15 illustrates a sensing criterion of a sense amplifier according to the number of programs of the charge trap transistor of FIG. 14. The horizontal axis of FIG. 7 represents the complementary bit line voltage level VBLB, and the vertical axis thereof represents the bit line voltage level VBL.

Referring to FIG. 1, FIG. 2, FIG. 14, and FIG. 15, the charge trap transistor CTT (the first sensing transistor ST1 of FIG. 14) may be programmed step by step by receiving the program voltage VPGM multiple times for each unit program time.

First, when the charge trap transistor CTT is not programmed (that is, when the charge trap transistor CTT is programmed '0' time), the sense amplifier SA may perform a sensing operation based on a 0-th sensing criterion CRTb_P0. For example, the sense amplifier SA may perform a sensing operation for the precharged bit line BL and complementary bit line BLB based on the 0-th sensing criterion CRTa_P0. In this case, since the precharge point PT_pre is positioned in an area above the 0-th sensing criterion CRTb_P0, the sensing circuit 231 may increase the bit line voltage level VBL to the power supply voltage VDD and decrease the complementary bit line voltage level VBLB to the ground voltage GND.

When the charge trap transistor CTT is programmed 'one time' for a unit program time (that is, when the charge trap transistor CTT is programmed '1' unit program time), the sense amplifier SA may perform a sensing operation based on the first sensing criterion CRTb_P1. For example, the sensing circuit 231 may increase the bit line voltage level VBL to the power supply voltage VDD and may decrease the complementary bit line voltage level VBLB to the ground voltage GND, similar to the above description.

In this way, as the number of times the program voltage VPGM is provided to the charge trap transistor CTT (for example, the first sensing transistor ST1) increases, the sensing criterion for which the sense amplifier SA performs the sensing operation may become similar to or approximate the ideal sensing criterion CRT_ideal.

For example, when the charge trap transistor CTT is programmed '(m−1) times' for each unit program time, the sense amplifier SA may perform a sensing operation based on the (m−1)-th sensing criterion CRTb_Pm−1. In this case, since the precharge point PT_pre is positioned in an area above the (m−1)-th sensing criterion CRTa_Pm−1, the sensing circuit 231 may increase the bit line voltage level VBL to the power supply voltage VDD and decrease the complementary bit line voltage level VBLB to the ground voltage GND.

Thereafter, when the charge trap transistor CTT is programmed 'one more time' as much as a unit program time (that is, when the charge trap transistor CTT is programmed 'm' unit program times), the sense amplifier SA may perform a sensing operation based on the m-th sensing criterion CRTb_Pm. However, in this case, unlike the previously performed sensing operation based on the first to (n−1)-th sensing criteria CRTb_P1 to CRTb_Pm−1, since the precharge point PT_pre is positioned in the area below the m-th sensing criterion CRTb_Pm, the bit line voltage level VBL may be decreased to the ground voltage GND and the complementary bit line voltage level VBLB may be increased to the power supply voltage VDD.

That is, unlike the case in which the charge trap transistor CTT is programmed 'm−1' times for each unit program time, when the charge trap transistor CTT is programmed 'm' times for each unit program time, the bit line voltage level VBL may decrease to the ground voltage GND as the sensing operation is performed. In this case, similar to that previously described with reference to FIG. 7, the m-th sensing criterion CRTa_Pm may be extremely similar to the ideal sensing criterion CRT_ideal. Therefore, according to some embodiments of the present disclosure, since the imbalance with respect to the bit line BL and the complementary bit line BLB of the sense amplifier SA may be compensated for or mitigated in a relatively fine manner, the sensing margin of the sense amplifier SA may be increased or maximized.

Figure 16:
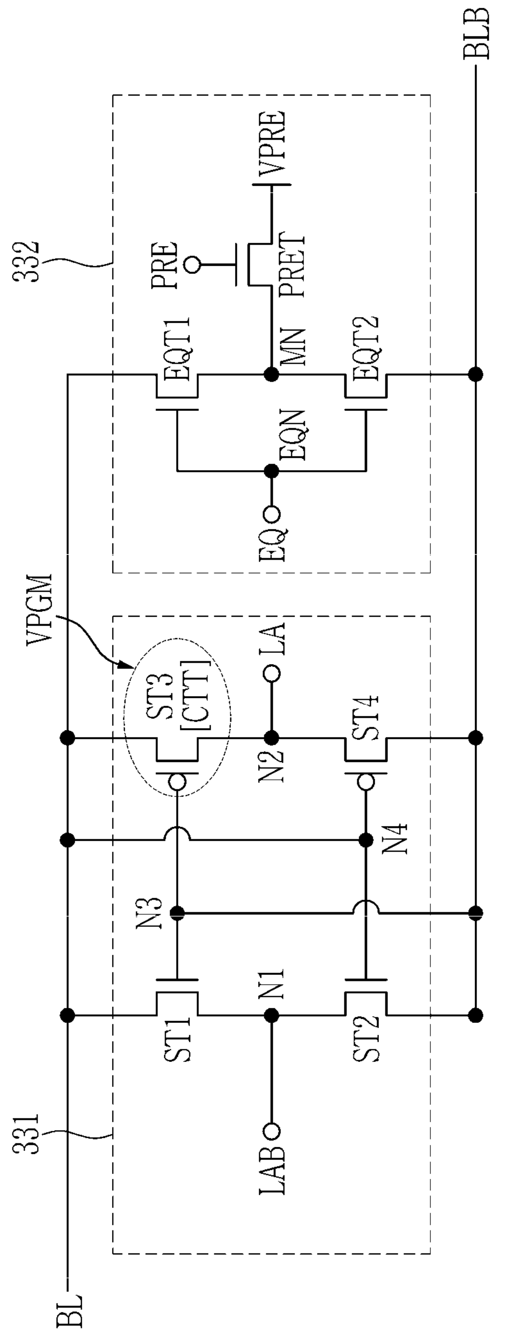
FIG. 16 illustrates the sense amplifier of FIG. 2 implemented according to some embodiments.

FIG. 16 illustrates the sense amplifier of FIG. 2 implemented according to some embodiments. Referring to FIG. 1, FIG. 2, and FIG. 16, the sensing circuit 131 may be implemented as a sensing circuit 331, and the equalizing circuit 132 may be implemented as an equalizing circuit 332.

The sensing circuit 331 may include first to fourth sensing transistors ST1 to ST4. The equalizing circuit 332 may include a first equalizing transistor EQT1, a second equalizing transistor EQT2, and a precharge transistor PRET. The configurations and operations of the first to fourth sensing transistors ST1 to ST4, the first equalizing transistor EQT1, the second equalizing transistor EQT2, and the precharge transistor PRET may be similar to those previously described with reference to FIG. 3, so detailed descriptions thereof will be omitted here in the interest of brevity.

The third sensing transistor ST3 may operate as the charge trap transistor CTT. For example, the third sensing transistor ST3 may be implemented as a high-k transistor. In this case, unlike that previously described with reference to FIG. 3, the third sensing transistor ST3 may be programmed in response to the program voltage VPGM. The method in which the imbalance in the connection to the bit line BL and complementary bit line BLB of the sense amplifier SA is compensated in response to the third sensing transistor ST3 being programmed may be similar to that described above, so detailed descriptions thereof is omitted here in the interest of brevity.

In some embodiments, the third sensing transistor ST3 may be implemented to be programmed by trapping holes in response to the program voltage VPGM. However, the present disclosure is not limited to the method the third sensing transistor ST3 is programmed.

In some embodiments, the third sensing transistor ST3 may be programmed in response to the program voltage VPGM having a negative voltage level. However, the present disclosure is not limited to the method the third sensing transistor ST3 is programmed.

In some embodiments, the third sensing transistor ST3 may be programmed in response to the program voltage VPGM having a negative voltage level being provided to the gate terminal. However, the present disclosure is not limited to the method the third sensing transistor ST3 is programmed.

In some embodiments, it may be implemented to trap a hole in response to a relatively high voltage being applied to the drain electrode of the third sensing transistor ST3 and a negative voltage being applied to the gate electrode of the third sensing transistor ST3. However, the present disclosure is not limited to the method the third sensing transistor ST3 is programmed.

Figure 17:
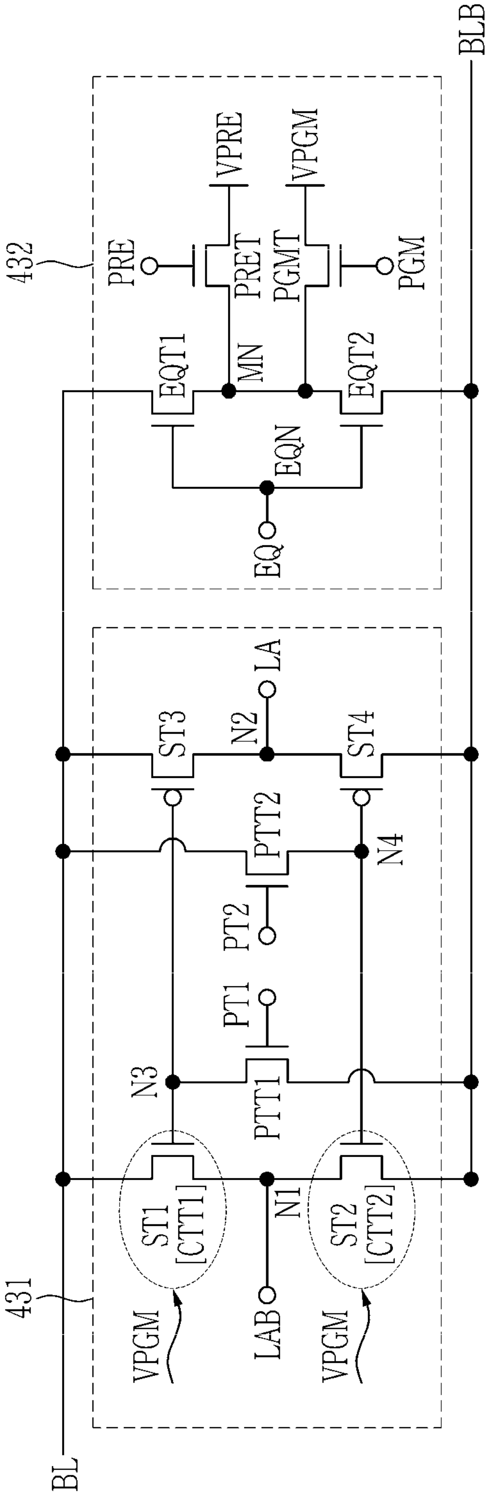
FIG. 17 illustrates a detailed circuit diagram of the sense amplifier of FIG. 2, which is implemented according to some embodiments of the present disclosure.

FIG. 17 illustrates a detailed circuit diagram of the sense amplifier of FIG. 2, which may be implemented according to some embodiments. Referring to FIG. 1, FIG. 2, and FIG. 17, the sensing circuit 131 may be implemented as a sensing circuit 431, and the equalizing circuit 132 may be implemented as an equalizing circuit 432.

The sensing circuit 431 may include first to fourth sensing transistors ST1 to ST4. The equalizing circuit 432 may include a first equalizing transistor EQT1, a second equalizing transistor EQT2, a precharge transistor PRET, and a program transistor PGMT. The configuration and operation of the first to fourth sensing transistors ST1 to ST4 and the equalizing circuit 432 may be similar to those previously described with reference to FIG. 3, so detailed descriptions thereof will be omitted here in the interest of brevity.

The first sensing transistor ST1 and the second sensing transistor ST2 may operate as a charge trap transistor CTT. For example, the first sensing transistor ST1 may operate as a first charge trap transistor CTT1, and the second sensing transistor ST2 may operate as a second charge trap transistor CTT2.

The program transistor PGMT may provide the program voltage VPGM to the first charge trap transistor CTT1 and the second charge trap transistor CTT2. The first charge trap transistor CTT1 and the second charge trap transistor CTT2 may trap charges in response to the program voltage VPGM.

The first charge trap transistor CTT1 and the second charge trap transistor CTT2 may compensate for or mitigate the imbalance in connection to the bit line BL and the complementary bit line BLB of the sense amplifier SA.

First, due to the imbalance in the connection to the bit line BL and the complementary bit line BLB of the sense amplifier SA, the sensing operation performed by the sense amplifier SA may have a higher tendency to increase the bit line voltage level VBL to the power supply voltage VDD than the complementary bit line voltage level VBLB. For example, even if the bit line BL and the complementary bit line BLB are precharged with the same voltage, the sense amplifier SA may perform the sensing operation and the bit line voltage level VBL may increase to the power supply voltage VDD. In this case, since the first charge trap transistor CTT1 is programmed in a method similar to that previously described with reference to FIG. 15, the imbalance in connection to the bit line BL and the complementary bit line BLB of the sense amplifier SA may be compensated for or mitigated.

Conversely, due to the imbalance in the connection to the bit line BL and the complementary bit line BLB of the sense amplifier SA, the sensing operation performed by the sense amplifier SA may have a higher tendency to increase the complementary bit line voltage level VBLB to the power supply voltage VDD than the bit line voltage level VBL. For example, even if the bit line BL and the complementary bit line BLB are precharged with the same voltage, the sense amplifier SA may perform the sensing operation and the complementary bit line voltage level VBLB may increase to the power supply voltage VDD. In this case, since the second charge trap transistor CTT2 is programmed in a method similar to that previously described with reference to FIG. 7, the imbalance in connection to the bit line BL and the complementary bit line BLB of the sense amplifier SA may be compensated for or mitigated.

The sensing circuit 431 may include a first protection transistor PTT1 and a second protection transistor PTT2. The first protection transistor PTT1 may be connected between the third node N3 and the complementary bit line BLB. The second protection transistor PTT2 may be connected between the fourth node N4 and the bit line BL.

The first protection transistor PTT1 may operate in response to a first protection signal PT1. The first protection transistor PTT1 may be turned off while a program operation is performed for the second charge trap transistor CTT2. In this case, even if the program voltage VPGM is provided to the bit line BL and the complementary bit line BLB, the program voltage VPGM may not be provided to the gate terminal (that is, the third node N3) of the first charge trap transistor CTT1.

The second protection transistor PTT2 may operate in response to a second protection signal PT2. The second protection transistor PTT2 may be turned off while a program operation is performed for the first charge trap transistor CTT1. In this case, even if the program voltage VPGM is provided to the bit line BL and the complementary bit line BLB, the program voltage VPGM may not be provided to the gate terminal (that is, the third node N3) of the second charge trap transistor CTT2.

That is, according to some embodiments of FIG. 17, the first charge trap transistor CTT1 and the second charge trap transistor CTT2 may be selectively programmed. In this case, the program voltage VPGM may be repeatedly provided to the first charge trap transistor CTT1 or the second charge trap transistor CTT2, such that the imbalance in the connection to the bit line BL and the complementary bit line BLB of the sense amplifier SA may be compensated for or mitigated. A method of programming the first charge trap transistor CTT1 and the second charge trap transistor CTT2 will be described in greater detail with reference to FIG. 18A and FIG. 18*b* below.

In some embodiments, the sense amplifier SA may program the first charge trap transistor CTT1 and the second charge trap transistor CTT2 in a binary search method to compensate for or mitigate the imbalance in the connection to the bit line BL and the complementary bit line BLB. An operation of the sense amplifier SA for programming the first charge trap transistor CTT1 and the second charge trap transistor CTT2 in the binary search method will be described in greater detail with reference to FIG. 19 and FIG. 20.

Figure 18A:
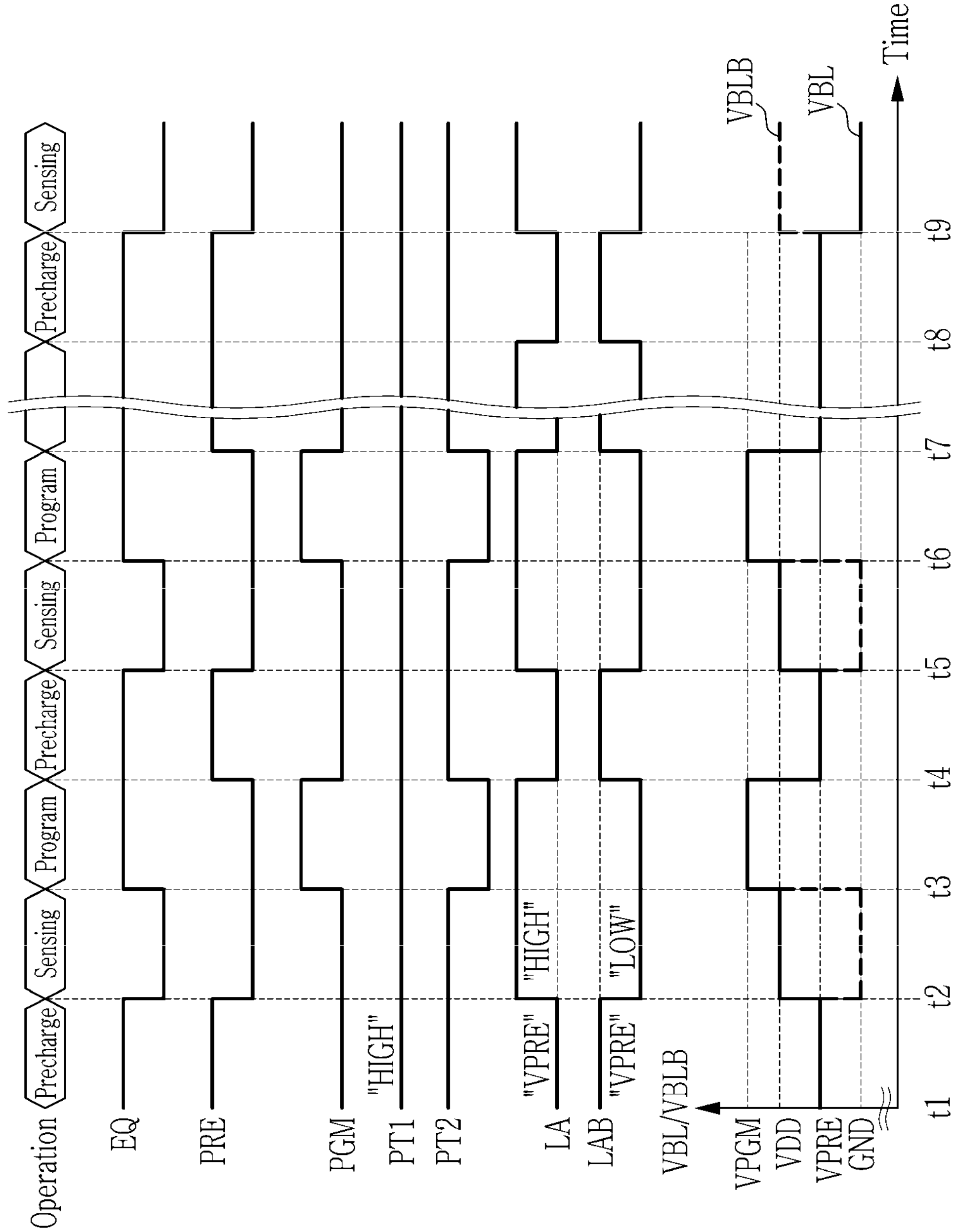
FIG. 18A and FIG. 18B illustrate timing diagrams of an operation of the sense amplifier of FIG. 17.
Figure 18B:
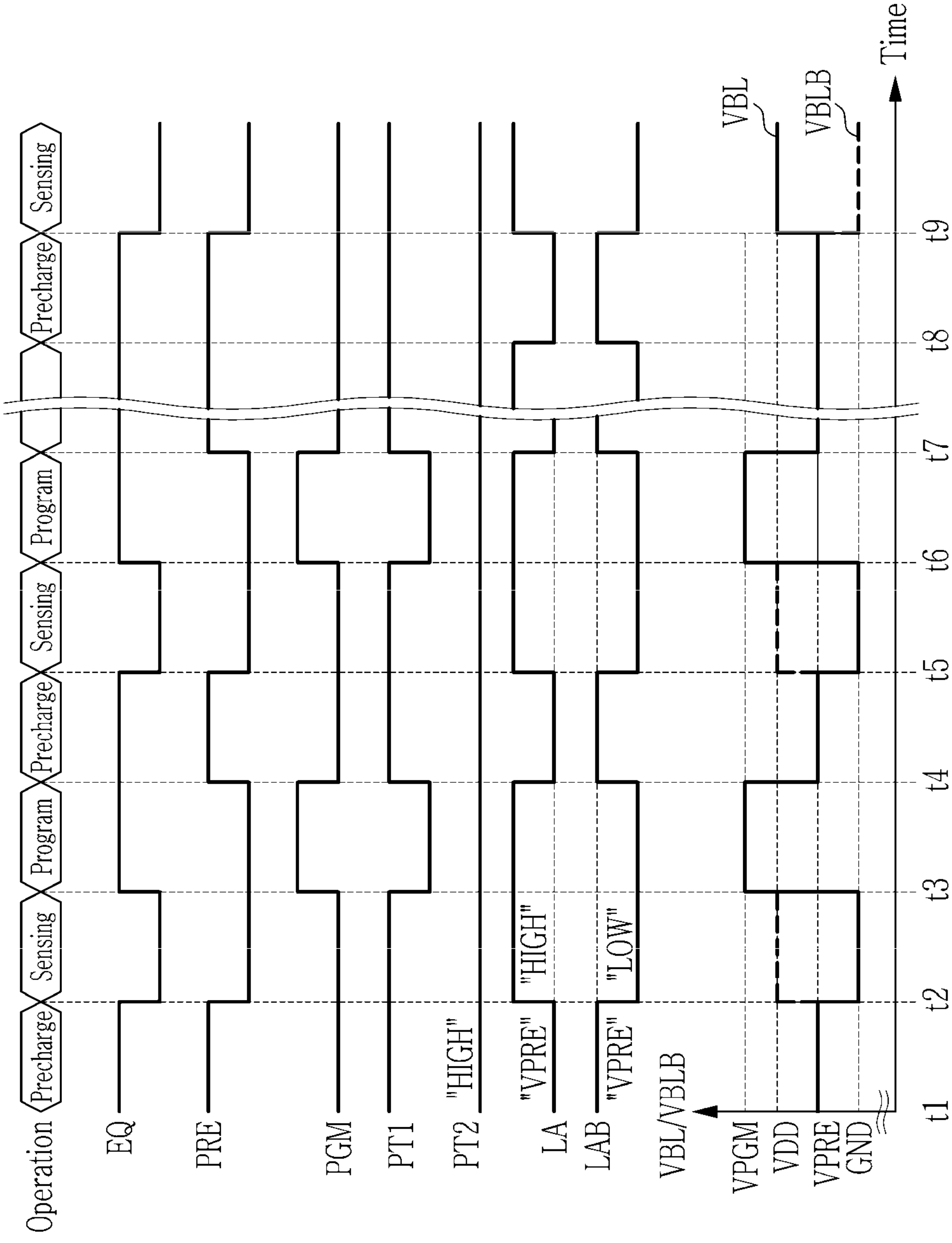

FIG. 18A and FIG. 18B illustrate timing diagrams of an operation of the sense amplifier of FIG. 17. Hereinafter, an example of an embodiment in which the first charge trap transistor CTT1 is programmed will be described with reference to FIG. 18A, and an example of an embodiment in which the second charge trap transistor CTT2 is programmed will be described with reference to FIG. 18B.

First, referring to FIG. 1, FIG. 2, FIG. 17, and FIG. 18A, the sense amplifier SA may perform a plurality of program cycles for the first charge trap transistor CTT1 during the first time point t1 to the eighth time point t8. That is, the sense amplifier SA may repeatedly perform a precharge operation (Precharge), a sensing operation (Sensing), and a program operation (Program) during the first time point t1 to the eighth time point t8. The method in which the sense amplifier SA performs the precharge operation (Precharge) and the sensing operation (Sensing) is similar to that previously described with reference to FIG. 13, so detailed descriptions thereof will be omitted herein in the interest of brevity.

When the sense amplifier SA performs the program operation (Program) for the first charge trap transistor CTT1, the first protection signal PT1 may be logic high, and the second protection signal PT2 may be logic low. For example, the second protection signal PT2 may be logic low between the third time point t3 and the fourth time point t4 and between the sixth time t6 and the seventh time t7. In this case, the program voltage VPGM may not be provided to the gate terminal (that is, the fourth node N4) of the second charge trap transistor CTT2 while the program operation (Program) for the first charge trap transistor CTT1 is performed.

On the other hand, referring to FIG. 1, FIG. 2, FIG. 17, and FIG. 18B, the sense amplifier SA may perform a plurality of program cycles for the second charge trap transistor CTT2 during the first time point t1 to the eighth time point t8. That is, the sense amplifier SA may repeatedly perform a precharge operation (Precharge), a sensing operation (Sensing), and a program operation (Program) during the first time point t1 to the eighth time point t8. The method in which the sense amplifier SA performs the precharge operation (Precharge) and the sensing operation is similar to that previously described with reference to FIG. 13, so detailed descriptions thereof will be omitted herein in the interest of brevity.

When the sense amplifier SA performs the program operation (Program) for the second charge trap transistor CTT2, the second protection signal PT2 may be logic high, and the first protection signal PT1 may be logic low. For example, the first protection signal PT1 may be logic low between the third time point t3 and the fourth time point t4 and between the sixth time t6 and the seventh time t7. In this case, the program voltage VPGM may not be provided to the gate terminal (that is, the third node N3) of the first charge trap transistor CTT1 while the program operation (Program) for the second charge trap transistor CTT2 is performed.

Figure 19:
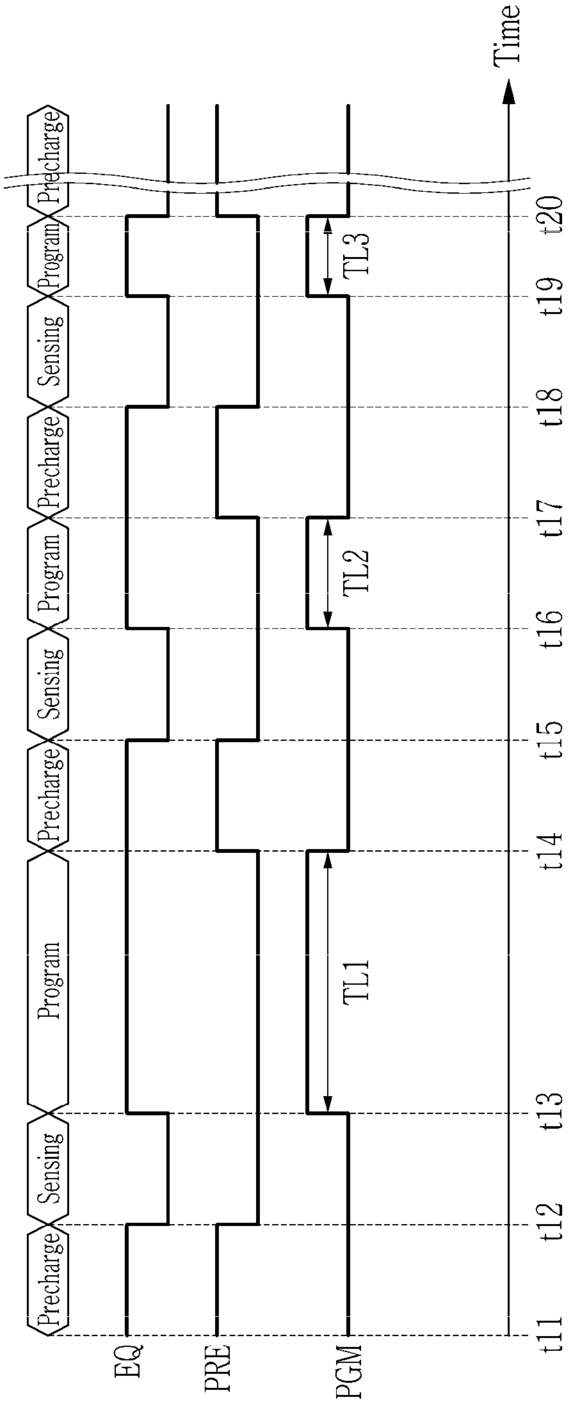
FIG. 19 illustrates a timing diagram of an operation of the sense amplifier of FIG. 17 according to some embodiments of the present disclosure.

FIG. 19 illustrates a timing diagram of an operation of the sense amplifier of FIG. 17 according to some embodiments. Referring to FIG. 1, FIG. 2, FIG. 17, and FIG. 19, during the eleventh time point t11 to the twentieth time point t20, the sense amplifier SA may perform a plurality of program cycles. That is, the sense amplifier SA may repeatedly perform a precharge operation (Precharge), a sensing operation (Sensing), and a program operation (Program) during the eleventh time point t11 to the twentieth time point t20.

More specifically, the sense amplifier SA may perform the program operation (Program) between the thirteenth time point t13 and the fourteenth time point t14, depending on the bit line voltage level VBL between the twelfth time point t12 and the thirteenth time point t13. For example, when the bit line voltage level VBL increases to the power supply voltage VDD between the twelfth time point t12 and the thirteenth time point t13 (that is, when the complementary bit line voltage level VBLB decreases to the ground voltage GND), the sense amplifier SA may program the first charge trap transistor CTT1 between the thirteenth time point t13 and the fourteenth time point t14. Conversely, when the bit line voltage level VBL decreases to the ground voltage GND between the twelfth time point t12 and the thirteenth time point t13 (that is, when the complementary bit line voltage level VBLB increases to the power supply voltage VDD), the sense amplifier SA may program the second charge trap transistor CTT2 between the thirteenth time point t13 and the fourteenth time point t14.

Similarly, the sense amplifier SA may perform the program operation (Program) between the sixteenth time point t16 and the seventeenth time point t17 and between the nineteenth time point t19 and the sixteenth time point t20. The method in which the sense amplifier SA performs the precharge operation (Precharge) and the sensing operation (Sensing) may be similar to that previously described with reference to FIG. 11, so detailed descriptions thereof will be omitted herein in the interest of brevity.

The sense amplifier SA may provide a program voltage VPGM for different time lengths per a plurality of program cycles. For example, an interval between the thirteenth time point t13 and the fourteenth time point t14 may be a first time length TL1, an interval between the sixteenth time point t16 and the seventeenth time point t17 may be a second time length TL2, and an interval between the nineteenth time point t19 and the twentieth time point t20 may be a third time length TL3.

The first time length TL1 may be longer than the second time length TL2. The second time length TL2 may be longer than the third time length TL3. That is, the sense amplifier SA may gradually decrease the time for providing the program voltage VPGM to the charge trap transistor CTT. In this case, the imbalance in the connection to the bit line BL and the complementary bit line BLB of the sense amplifier SA may be adjusted in a relatively coarse manner and then adjusted in a relatively fine manner.

In some embodiments, the time for the sense amplifier SA to provide the program voltage VPGM per the plurality of program cycles may be reduced by half. For example, the second time length TL2 may be '½' of the first time length TL1, and the third time length TL3 may be '½' of the second time length TL2. That is, the sense amplifier SA may program the first charge trap transistor CTT1 and the second charge trap transistor CTT2 using a binary search method. In this case, the first charge trap transistor CTT1 and the second charge trap transistor CTT2 may be sequentially programmed so that the imbalance in the connection to the bit line BL and the complementary bit line BLB of the sense amplifier SA may be compensated for or mitigated relatively accurately.

Figure 20:
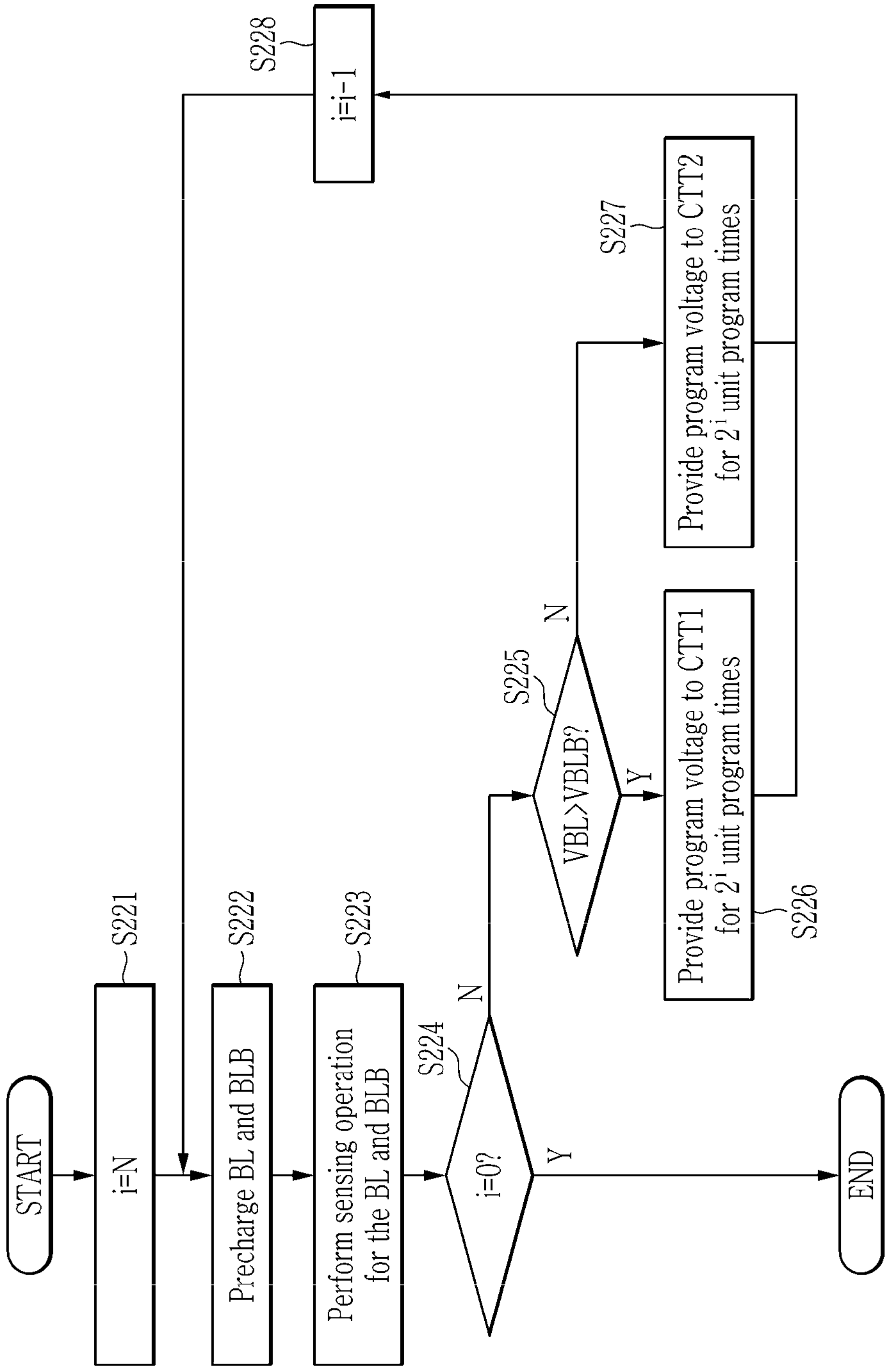
FIG. 20 illustrates a detailed flowchart of step S120 of FIG. 8 implemented according to the timing diagram of FIG. 19.

FIG. 20 illustrates a detailed flowchart of operation S120 of FIG. 8 implemented according to the timing diagram of FIG. 19. Referring to FIG. 1, FIG. 2, FIG. 8, FIG. 17, FIG. 19, and FIG. 20, operation S120 may include the following operations (or sub-operations) S221 to S228.

In operation S221, variable (i) may be set to 'N'. The variable (i) may be used only herein to describe how the charge trap transistor CTT is repeatedly programmed, and does not limit the scope of present disclosure.

In some embodiments, 'N' may be an integer greater than or equal to 2.

In operation S222, the memory device 100 may precharge the bit line BL and the complementary bit line BLB. In operation S223, the sense amplifier SA may perform a sensing operation for the bit line BL and the complementary bit line BLB. Operations S222 and S223 may be similar to operations S121 and S122 described with reference to FIG. 9, so detailed descriptions thereof are omitted herein in the interest of brevity.

In operation S224, the memory device 100 may determine whether the variable (i) is '0'. When the variable (i) is '0' ("Y" branch from operation S224), operation S120 may exit. When the variable (i) is not '0' ("N" branch from operation S224), operation S225 below may be performed.

In operation S225, the memory device 100 may determine whether the bit line voltage level VBL is higher than the complementary bit line voltage level VBLB. That is, the memory device 100 may determine whether the bit line voltage level VBL is the power supply voltage VDD.

When the bit line voltage level VBL is higher than the complementary bit line voltage level VBLB ("Y" branch from operation S225), operation S226 below may be performed. In other words, in response to the voltage level of the bit line BL being greater than the voltage level of the complementary bit line BLB ("Y" branch from operation S225), operation S227 below may be performed.

When the voltage level of the bit line BL is lower than or equal to the voltage level of the complementary bit line BLB ("N" branch from operation S225), operation S227 below may be performed. In other words, in response to the voltage level of the bit line BL being lower than or equal to the voltage level of the complementary bit line BLB ("N" branch from operation S225), operation S227 below may be performed.

In operation S226, the memory device 100 may provide the program voltage VPGM to the first charge trap transistor CTT1 for a time length corresponding to $2^i$ times the unit program time.

In operation S227, the memory device 100 may provide the program voltage VPGM to the second charge trap transistor CTT2 for a time length corresponding to 2i times the unit program time.

In operation S228, the memory device 100 may decrease the variable (i) by '1'. Thereafter, operation S222 described above may be repeatedly performed. In this way, the first charge trap transistor CTT1 and the second charge trap transistor CTT2 may be sequentially programmed so that the sense amplifier SA may perform the sensing operation based on the ideal sensing criterion CRT_ideal.

Figure 21:
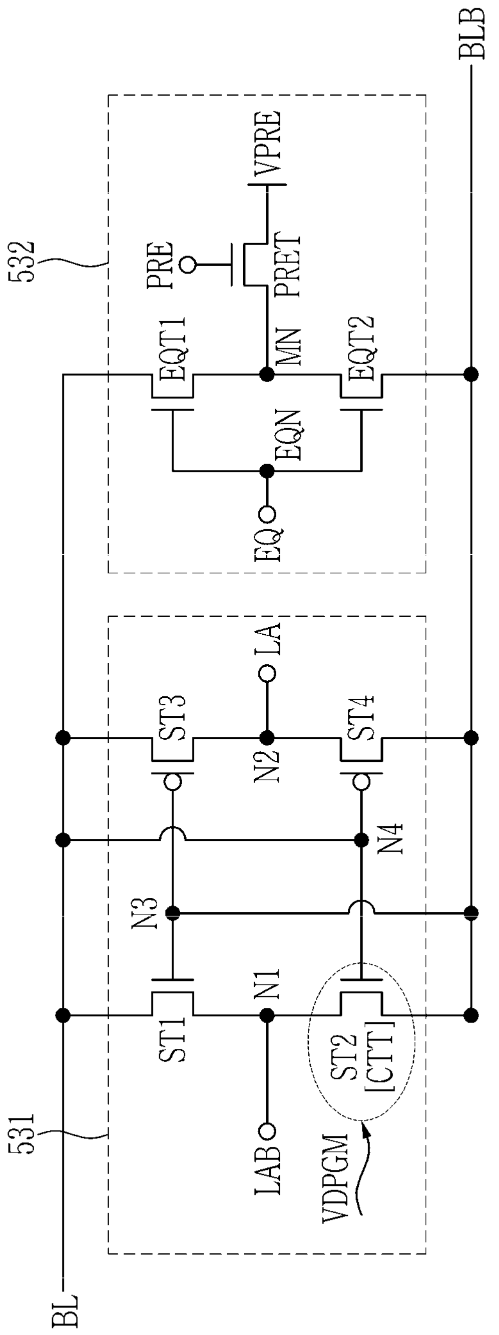
FIG. 21 illustrates a detailed circuit diagram of the sense amplifier of FIG. 2 implemented according to some embodiments of the present disclosure.

FIG. 21 illustrates a detailed circuit diagram of the sense amplifier of FIG. 2 implemented according to some embodiments. Referring to FIG. 1, FIG. 2, and FIG. 21, the sensing circuit 131 may be implemented as a sensing circuit 531, and the equalizing circuit 132 may be implemented as an equalizing circuit 532.

The sensing circuit 531 may include first to fourth sensing transistors ST1 to ST4. The equalizing circuit 532 may include a first equalizing transistor EQT1, a second equalizing transistor EQT2, and a precharge transistor PRET. The configurations and operations of the first to fourth sensing transistors ST1 to ST4, the first equalizing transistor EQT1, the second equalizing transistor EQT2, and the precharge transistor PRET may be similar to those previously described with reference to FIG. 3, so detailed descriptions thereof will be omitted herein in the interest of brevity.

The second sensing transistor ST2 may operate as a charge trap transistor CTT. For example, the second sensing transistor ST2 may trap charges.

The second sensing transistor ST2 may receive a de-program voltage VDPGM. The second sensing transistor ST2 may de-trap charges in response to the de-program voltage VDPGM. For example, in response to a negative voltage being provided to the gate terminal and a high voltage being provided to the drain terminal, the second sensing transistor ST2 may de-trap charges. However, the present disclosure is not limited to the specific method in which the second sensing transistor ST2 de-traps charges.

That is, according to some embodiments as seen in FIG. 21, the second sensing transistor ST2 may compensate for or mitigate the imbalance in the connection to the bit line BL and the complementary bit line BLB of the sensing amplifier SA by de-trapping the charge trapped in the second sensing transistor ST2. However, the present disclosure is not limited thereto.

Figure 22:
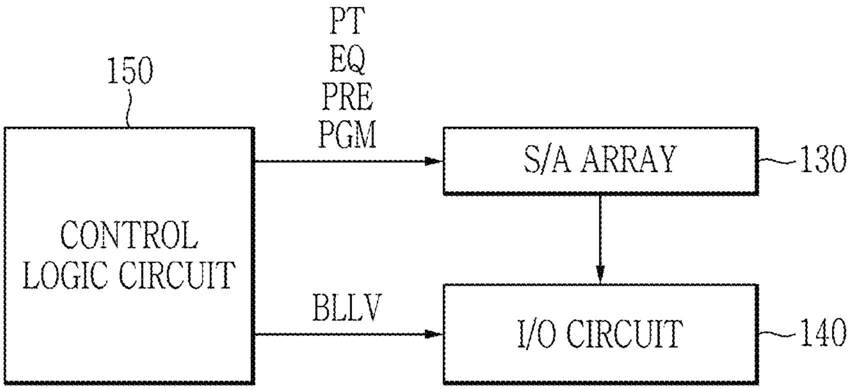
FIG. 22 illustrates a block diagram of some components of the memory device of FIG. 1 according to some embodiments of the present disclosure.

FIG. 22 illustrates a block diagram of some components of the memory device of FIG. 1 according to some embodiments. Referring to FIG. 1 and FIG. 21, the control logic circuit 150 may control each sense amplifier SA included in the sense amplifier array 130 to perform the precharge operation, the sensing operation, and the program operation. For example, the control logic circuit 150 may provide the precharge signal PRE, the protection signal PT, the equalizing signal EQ, and the program signal PGM to the sense amplifier array 130. However, hereinafter, for a more concise description, an embodiment in which the control logic circuit 150 controls one sense amplifier SA will be representatively described.

The sense amplifier SA included in the sense amplifier array 130 may perform the precharge operation and the sense operation for the connected bit line BL and complementary bit line BLB. For example, based on the voltage levels of the precharged bit line BL and complementary bit line BLB, the sense amplifier SA may increase the voltage levels of the bit line BL and the complementary bit line BLB to the power supply voltage VDD or decrease them to the ground voltage GND.

The input/output circuit 140 may store bit line level data BLLV corresponding to the bit line voltage level VBL after the sensing operation is performed. For example, when the bit line voltage level VBL is the power supply voltage VDD, the bit line level data BLLV may indicate '1', and when the bit line BL has the ground voltage GND level, the bit line level data BLLV may indicate '0'.

The input/output circuit 140 may provide the bit line level data BLLV to the control logic circuit 150. That is, the input/output circuit 140 may provide data representing the bit line voltage level VBL to the control logic circuit 150 after the sensing operation is performed.

The control logic circuit 150 may adjust the logic levels of the protection signal PT and the program signal PGM in response to the bit line level data BLLV.

For a more concise description, in FIG. 22, an embodiment in which the control logic circuit 150 controls the operation of the sense amplifier SA in response to bit line level data BLLV stored in the input/output circuit 140 is representatively described, but the present disclosure is not limited thereto. For example, the control logic circuit 150 may receive (e.g., directly receive) the voltage level of the bit line BL and control the operation of the sense amplifier SA based on the received voltage level.

Figure 23:
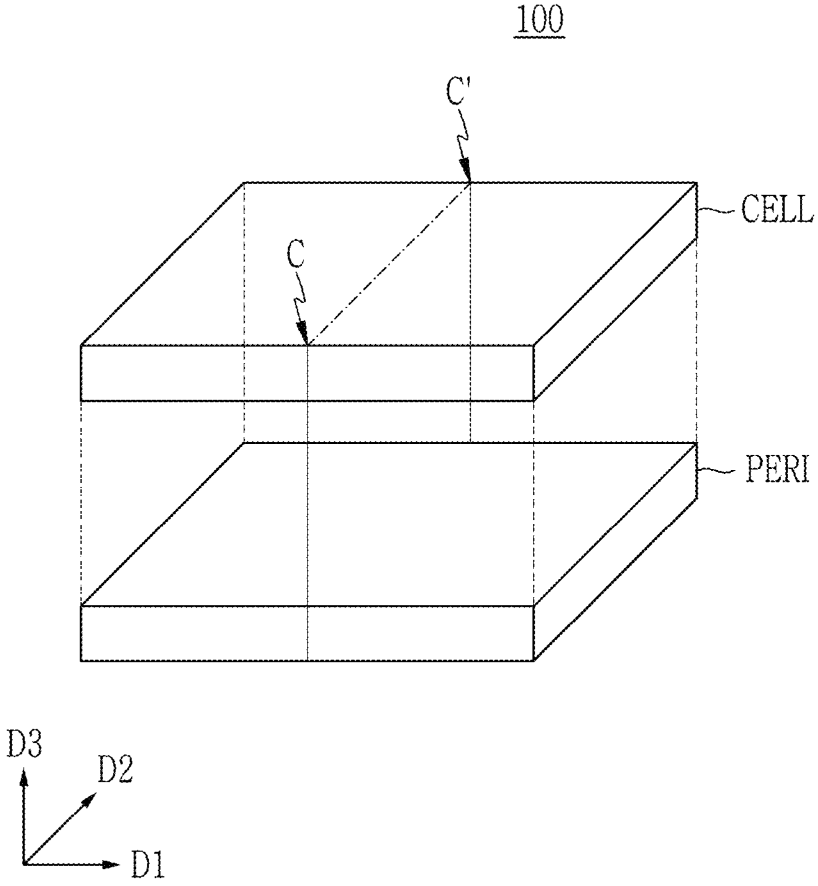
FIG. 23 illustrates a perspective view of the memory device of FIG. 1 implemented according to some embodiments of the present disclosure.

FIG. 23 illustrates a perspective view of the memory device of FIG. 1 implemented according to some embodiments. Referring to FIG. 1 to FIG. 23, the memory device 100 may include a peripheral circuit area PERI and a memory cell area CELL. The memory cell area CELL may be three-dimensionally stacked on the peripheral circuit area PERI along the third direction D3. That is, the memory device 100 may have a Cell on Peri (CoP) structure.

The memory cell area CELL may include the memory cell array 110. The peripheral circuit area PERI may include the row decoder 120, the sense amplifier array 130, the input/output circuit 140, and the control logic circuit 150.

Figure 24:
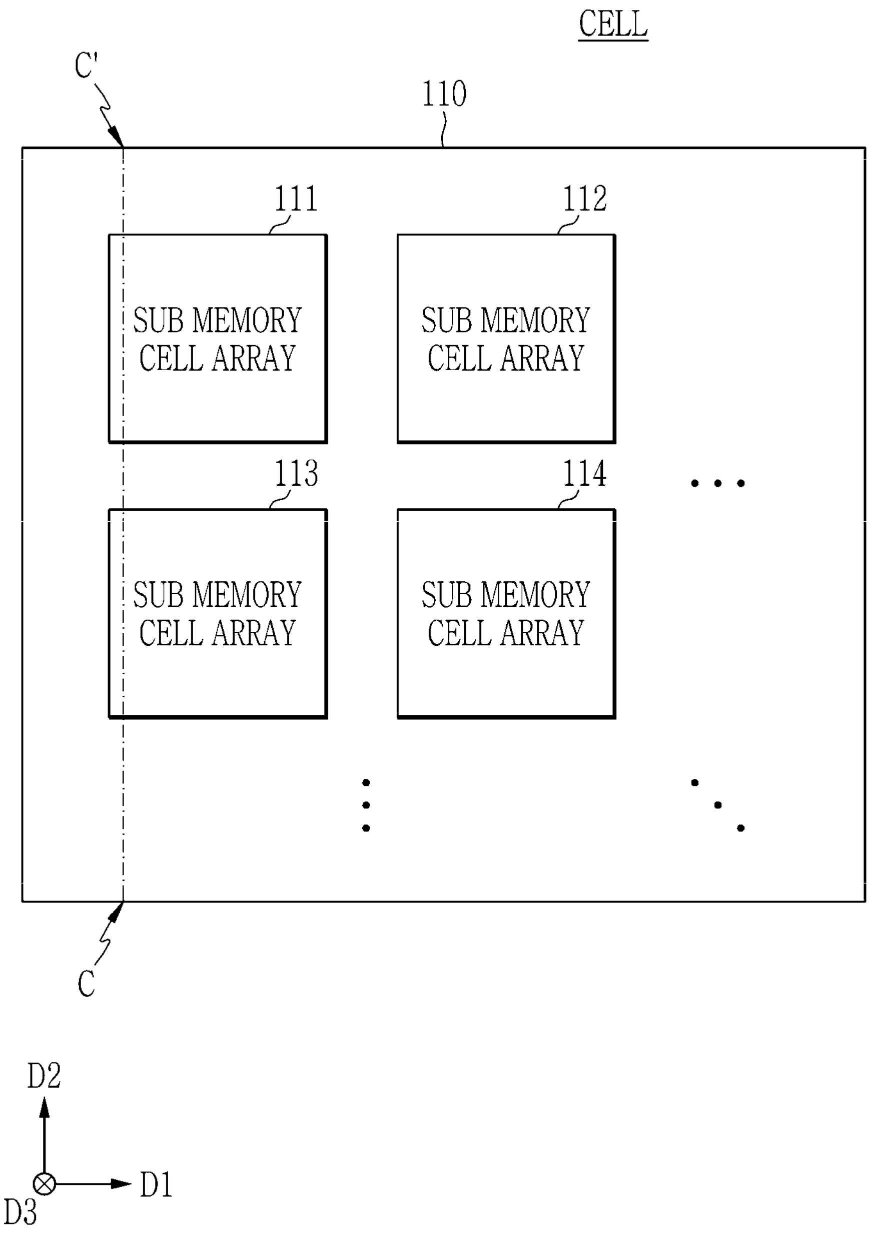
FIG. 24 illustrates a top plan view of a memory cell area (CELL) of FIG. 23.

FIG. 24 illustrates a top plan view of a memory cell area (CELL) of FIG. 23. Referring to FIG. 1 to FIG. 24, the memory cell area CELL may include the memory cell array 110. The memory cell array 110 may include a plurality of sub-memory cell arrays 111 to 114.

Each of the plurality of sub-memory cell arrays 111 to 114 may be in a matrix structure along the first direction D1 and the second direction D2. The plurality of sub-memory cell arrays 111 to 114 may be spaced apart from each other, respectively. However, the present disclosure is not limited thereto, and the plurality of sub-memory cell arrays 111 to 114 may be adjacent to each other.

The sub-memory cell array 111 and the sub-memory cell array 112 may share one or more sense amplifiers SA. For example, the first sense amplifier shared by the sub-memory cell array 111 and the sub-memory cell array 112 may be connected to the bit line BL connected to the sub-memory cell array 111 and to the complementary bit line BLB connected to the sub-memory cell array 112.

Figure 25:
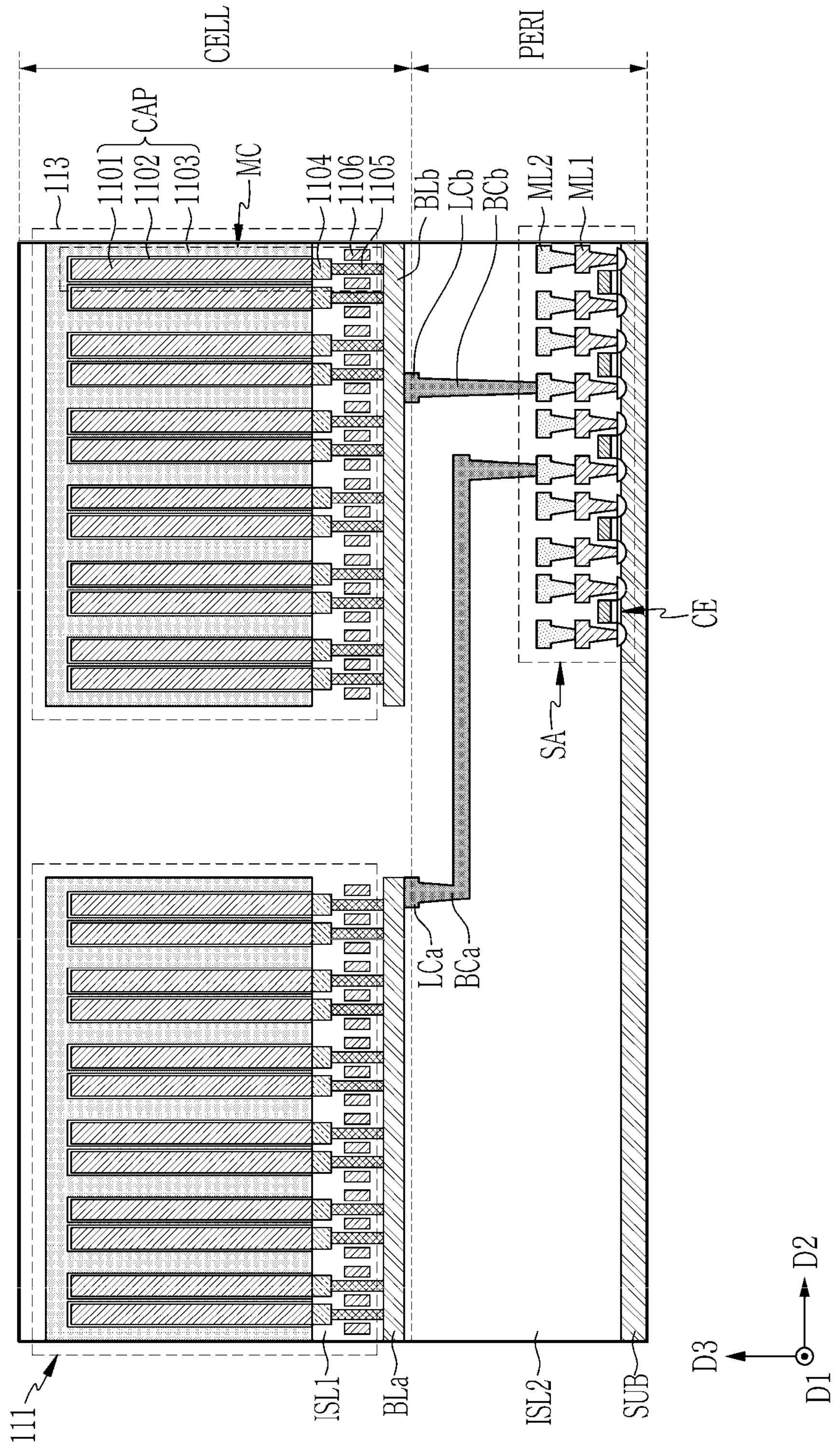
FIG. 25 illustrates a cross-sectional view taken along line C-C' of FIG. 23 and FIG. 24.

FIG. 25 illustrates a cross-sectional view taken along line C-C' of FIG. 23 and FIG. 24. Referring to FIG. 1 to FIG. 25, each of the sub-memory cell array 111 and the sub-memory cell array 112 may include a plurality of memory cells MC. In this case, each of the plurality of memory cells MC shown in FIG. 25 may be a memory cell arranged in the same column of the memory cell array 110.

Each of the plurality of memory cells MC may include a capacitor structure CAP, a capacitor contact 1104, a memory channel layer 1105, and a gate electrode 1106.

The capacitor structure CAP may include a lower electrode 1101, a capacitor dielectric layer 1102, and an upper electrode 1103. The lower electrode 1101 may be electrically connected to the capacitor contact 1104. The lower electrode 1101 may be formed as a pillar type extending in the third direction D3. However, the present disclosure is not limited thereto.

The capacitor contact 1104 may be on the memory channel layer 1105. That is, the capacitor contact 1104 may be stacked on the memory channel layer 1105 in the third direction D3.

The gate electrode 1106 may extend in the first direction D1 at both sides of the memory channel layer 1105.

A first interlayer insulating film ISL1 may be between the gate electrode 1106 and the memory channel layer 1105. For a more concise description, the first interlayer insulating film ISL1 is illustrated as one continuous material layer in FIG. 25, but the present disclosure is not limited thereto, and the first interlayer insulating film ISL1 may be formed of a plurality of insulating patterns.

The plurality of memory cells MC included in the sub-memory cell array 111 may be connected to a first bit line BLa. The plurality of memory cells MC included in the sub-memory cell array 113 may be connected to a second bit line BLb. The first bit line BLa and the second bit line BLb may extend along the second direction D2.

The first bit line BLa may be connected to the peripheral circuit area PERI through a first layer contact LCa. For example, the first bit line BLa may be connected to a first bit line contact BCa through the first layer contact LCa.

The second bit line BLb may be connected to the peripheral circuit area PERI through a second layer contact LCb. For example, the second bit line BLb may be connected to a second bit line contact BCb through the second layer contact LCb.

For a more concise description, an embodiment in which the first layer contact LCa and the second layer contact LCb are included in the peripheral circuit area PERI is representatively described in FIG. 24, but the present disclosure is not limited thereto. For example, the first layer contact LCa and the second layer contact LCb may be included in the memory cell area CELL.

The peripheral circuit area PERI may include a substrate SUB, a second interlayer insulating film ISL2, and a plurality of circuit elements CE formed on the substrate SUB. The peripheral circuit area PERI may include a first metal layer ML1 and a second metal layer ML2 connected to the plurality of circuit elements CE.

For a more concise description, only the first metal layer ML1 and the second metal layer ML2 are shown in FIG. 24, but the present disclosure is not limited thereto, and one or more metal layers may be further formed on the second metal layer ML2. In this case, at least some of the one or more metal layers formed on the second metal layer ML2 may be made of a material having a lower resistance than the material forming the second metal layer ML2.

The plurality of circuit elements CE included in the peripheral circuit area PERI may form the sense amplifier SA. The sense amplifier SA may be connected to the first bit line BLa and the second bit line BLb through the first layer contact LCa and the second layer contact LCb, respectively. In this case, the first bit line BLa may be the bit line BL with respect to the sense amplifier SA, and the second bit line BLb may be the complementary bit line BLB with respect to the sense amplifier SA. However, the present disclosure is not limited thereto.

In some embodiments, lengths of the first layer contact LCa and the second layer contact LCb may be different. For example, the first layer contact LCa may be longer than the second layer contact LCb. In this case, a value of the resistor connected between the sense amplifier SA and the first bit line BLa may be larger than that of the resistor connected between the sense amplifier SA and the second bit line BLb. That is, similar to that described with reference to FIG. 22 to FIG. 24, when the memory device 100 is implemented in a CoP structure, the connection of the sense amplifier SA to the first bit line BLa and the second bit line BLb may be unbalanced.

In some embodiments, the connection of the sense amplifier SA to the first bit line BLa and the second bit line BLb may be compensated for or mitigated by additionally connecting a resistor or a capacitor to the first bit line BLa or the second bit line BLb. However, in this case, the design complexity of the memory device 100 may increase.

In some embodiments, the sense amplifier SA may include the charge trap transistor CTT. For example, the sense amplifier SA may include the charge trap transistor CTT that traps charges to compensate for or mitigate the imbalance in the connection to the first bit line BLa and the second bit line BLb of the sense amplifier SA. In this case, even if the memory device 100 is implemented in a CoP structure, the imbalance in the connection between the first bit line BLa and the second bit line BLb of the sense amplifier SA may be compensated for or mitigated. That is, according to some embodiments of the present disclosure, even though the design complexity of the memory device 100 is minimized, the imbalance in the connection to the first bit line BLa and the second bit line BLb of the sense amplifier SA may be compensated for or mitigated.

The above-described contents are specific embodiments for implementing the present disclosure. The present disclosure will include not only the above-described embodiments, but also embodiments that encompass relatively simple design changes or other easily implementable changes. In addition, the present disclosure will also include techniques that may be easily modified and implemented by using the examples of embodiments. While the present disclosure has been described with reference to some examples of embodiments thereof, it will be apparent to those of ordinary skill in the art that various changes and modifications may be made thereto without departing from the scope of the disclosure as set forth in the following claims.

What is claimed is:

1. A sense amplifier connected to a bit line and a complementary bit line, comprising:

a first transistor connected between the bit line and a first node, the first transistor including a first gate terminal connected to a third node;

a second transistor connected between the first node and the complementary bit line, the second transistor including a second gate terminal connected to a fourth node;

a third transistor connected between the bit line and a second node, the third transistor including a third gate terminal connected to the third node;

a fourth transistor connected between the complementary bit line and the second node, the fourth transistor including a fourth gate terminal connected to the fourth node; and a protection transistor connected between the third node and the complementary bit line, wherein a first resistance-capacitance (RC) value as viewed from the sense amplifier toward the bit line is smaller than a second RC value as viewed from the sense amplifier toward the complementary bit line, wherein the second transistor is configured to receive a program voltage that is higher than a power supply voltage during a first time period, and wherein the protection transistor is turned off during the first time period.

2. The sense amplifier of claim 1, wherein:

the bit line and the complementary bit line are further configured to receive a precharge voltage between the power supply voltage and a ground voltage during a second time period preceding the first time period.

3. The sense amplifier of claim 2, wherein:

the first node is configured to receive a first driving signal having a voltage level corresponding to the ground voltage, during the first time period, and the second node is configured to receive a second driving signal having a voltage level corresponding to the power supply voltage, during the first time period.

4. The sense amplifier of claim 3, wherein:

a voltage level of the complementary bit line is higher than a voltage level of the bit line, during a third time period between the first and second time periods in which a first sensing operation for the bit line and the complementary bit line is performed.

5. The sense amplifier of claim 4, wherein the first sensing operation is performed based on voltage levels of the bit line and the complementary bit line that are precharged during the second time period.

6. The sense amplifier of claim 2, wherein the second transistor is configured to receive the program voltage through the fourth node and the complementary bit line during the first time period.

7. The sense amplifier of claim 6, wherein the second transistor is further configured to receive the program voltage during a fourth time period after the first time period.

8. The sense amplifier of claim 7, wherein:

the bit line and the complementary bit line are further configured to receive the precharge voltage during a fifth time period between the first time period and the fourth time period, and a voltage level of the complementary bit line is higher than a voltage level of the bit line, during a sixth time period between the fourth and fifth time periods in which a second sensing operation for the bit line is performed.

9. The sense amplifier of claim 8, wherein:

the bit line and the complementary bit line are further configured to receive the precharge voltage during a seventh time period after the fourth time period, and a voltage level of the bit line is higher than a voltage level of the complementary bit line, during an eighth time period after the seventh time period in which a third sensing operation for the bit line is performed.

10. The sense amplifier of claim 1, wherein:

the first and second transistors are N-type transistors, the third and fourth transistors are P-type transistors, and the second transistor is a high-k transistor.

11. An operation method of a sense amplifier connected to a bit line and a complementary bit line, the operation method comprising:

performing a first precharge operation for the bit line and the complementary bit line;

performing a first sensing operation for the bit line and the complementary bit line precharged based on the first precharge operation;

in response to a voltage level of the bit line changing to a first voltage level based on the first sensing operation, performing a first program operation for a first transistor connected to one of the bit line and the complementary bit line;

performing a second precharge operation for the bit line and the complementary bit line;

performing a second sensing operation for the bit line and the complementary bit line precharged based on the second precharge operation;

in response to the voltage level of the bit line changing to the first voltage level based on the second sensing operation, performing a second program operation for the first transistor; and in response to the voltage level of the bit line changing to a second voltage level different from the first voltage level based on the second sensing operation, ceasing performing program operations for the first transistor.

12. The operation method of claim 11, wherein:

a first time length for which the first program operation is performed and a second time length for which the second program operation is performed are identical.

13. The operation method of claim 11, wherein the first precharge operation and the first sensing operation are performed continuously.

14. The operation method of claim 11, wherein:

the sense amplifier includes a cross-coupled differential amplifier, and the first transistor is one of a plurality of transistors included in the cross-coupled differential amplifier.

15. The operation method of claim 11, further comprising:

in response to the voltage level of the bit line changing to a second voltage level different from the first voltage level based on the first sensing operation, programming a second transistor connected to one of the bit line and the complementary bit line.

16. A memory device comprising:

a memory cell array connected to a bit line and a complementary bit line; and a sense amplifier connected to the bit line through a first conductive line and connected to the complementary bit line through a second conductive line having a different length from the first conductive line, wherein the sense amplifier includes:

first and second transistors connected in series between the first conductive line and the second conductive line and having a first channel type;

third and fourth transistors connected in series between the first conductive line and the second conductive line and having a second channel type; and a fifth transistor connected between a gate terminal of the first transistor and the second conductive line, wherein threshold voltages of the first and second transistors are different from each other.

* * * * *